United States Patent
Lee et al.

(10) Patent No.: US 9,805,807 B2
(45) Date of Patent: Oct. 31, 2017

(54) OPERATION METHOD OPERATING NONVOLATILE MEMORY DEVICE HAVING PLURALITY OF MEMORY BLOCKS

(71) Applicant: SAMSUNG ELECTRONICS CO., LTD., Suwon-si, Gyeonggi-do (KR)

(72) Inventors: Cheon An Lee, Suwon-si (KR); Mu-Hui Park, Hwaseong-si (KR); Jiho Cho, Suwon-si (KR); Ji-Young Lee, Suwon-si (KR); Yoon-Hee Choi, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/003,113

(22) Filed: Jan. 21, 2016

(65) Prior Publication Data
US 2016/0260489 A1    Sep. 8, 2016

(30) Foreign Application Priority Data
Mar. 2, 2015 (KR) .................. 10-2015-0029191

(51) Int. Cl.
| | |
|---|---|
| G11C 16/04 | (2006.01) |
| G11C 16/16 | (2006.01) |
| G11C 16/26 | (2006.01) |
| G11C 16/10 | (2006.01) |
| G11C 16/34 | (2006.01) |
| G11C 16/08 | (2006.01) |

(52) U.S. Cl.
CPC .............. *G11C 16/16* (2013.01); *G11C 16/10* (2013.01); *G11C 16/26* (2013.01); *G11C 16/3427* (2013.01); *G11C 16/08* (2013.01)

(58) Field of Classification Search
CPC .............................. G11C 16/10; G11C 16/30
USPC ........................ 365/185.18, 185.17, 185.16
See application file for complete search history.

(56) References Cited

U.S. PATENT DOCUMENTS

| | | |
|---|---|---|
| 7,251,161 B2 | 7/2007 | Yano et al. |
| 7,679,133 B2 | 3/2010 | Son et al. |
| 8,018,777 B2 | 9/2011 | Kang |
| 8,085,595 B2 | 12/2011 | Kim et al. |
| 8,139,417 B2 | 3/2012 | Kim et al. |
| 8,427,878 B2 | 4/2013 | Shim et al. |
| 8,553,466 B2 | 10/2013 | Han et al. |
| 8,559,235 B2 | 10/2013 | Yoon et al. |
| 8,654,587 B2 | 2/2014 | Yoon et al. |

(Continued)

FOREIGN PATENT DOCUMENTS

| | | |
|---|---|---|
| JP | 2001-084786 | 3/2001 |
| KR | 1020080104579 | 12/2008 |

(Continued)

*Primary Examiner* — Connie Yoha
(74) *Attorney, Agent, or Firm* — F. Chau & Associates, LLC

(57) ABSTRACT

A method of operating a nonvolatile memory device is provided as follows. The nonvolatile memory device includes memory blocks each of which has word lines. A setup voltage is applied to the word lines. A word line voltage is applied to a first word line selected from the word lines. Recovery voltages are applied to the word lines. Each recovery voltage is applied to at least one corresponding word line of the word lines. The recovery voltages have different voltage levels from each other.

7 Claims, 29 Drawing Sheets

(56) References Cited

U.S. PATENT DOCUMENTS

| | | | |
|---|---|---|---|
| 2009/0168533 A1* | 7/2009 | Park | G11C 5/02 365/185.17 |
| 2011/0233648 A1 | 9/2011 | Seol et al. | |
| 2012/0039130 A1* | 2/2012 | Yoon | G11C 16/0483 365/185.18 |
| 2013/0051152 A1 | 2/2013 | Lee et al. | |
| 2013/0100747 A1 | 4/2013 | Leem | |
| 2015/0003169 A1* | 1/2015 | Nam | G11C 16/26 365/185.25 |
| 2015/0318045 A1 | 11/2015 | Yun | |
| 2016/0118123 A1 | 4/2016 | Jung et al. | |
| 2016/0225454 A1* | 8/2016 | Kim | G11C 16/10 |

FOREIGN PATENT DOCUMENTS

| | | |
|---|---|---|
| KR | 1020150125813 | 11/2015 |
| KR | 1020160047661 | 5/2016 |

* cited by examiner

OPERATION METHOD OPERATING NONVOLATILE MEMORY DEVICE HAVING PLURALITY OF MEMORY BLOCKS

CROSS-REFERENCE TO RELATED APPLICATION

This application claims priority under 35 U.S.C. §119 to Korean Patent Application No. 10-2015-0029191 filed Mar. 2, 2015, in the Korean Intellectual Property Office, the disclosure of which is incorporated by reference herein in its entirety.

TECHNICAL FIELD

The present inventive concept relates to a nonvolatile memory device, a storage device having the same, and an operation method thereof.

DISCUSSION OF THE RELATED ART

Storage devices may store data in response to a control of a host device such as a computer, a smart phone, a smart pad and the like. The storage devices may include a device to store data on a magnetic disk such as a hard disk drive (HDD), a semiconductor memory such as a solid state drive (SSD), a memory card and the like, in particular, a device to store data at a nonvolatile memory.

The nonvolatile semiconductor memories may include a read only memory (ROM), a programmable ROM (PROM), an electrically programmable ROM (EPROM), a flash memory, a phase-change memory (PRAM), a magnetic RAM (MRAM), a resistive RAM (RRAM), a ferroelectric RAM (FRAM), and the like.

As semiconductor manufacturing technology advances, the integration and capacity of storage devices have been increased. The higher integration of the storage devices may have an advantage of reducing a production cost of the storage device. With the high integration of the storage devices, the storage devices may be scaled down and/or may be changed in structures. In this case, a variety of problems may be newly found.

SUMMARY

According to an exemplary embodiment of the present inventive concept, a method of operating a nonvolatile memory device is provided as follows. The nonvolatile memory device includes memory blocks each of which has word lines. A setup voltage is applied to the word lines. A word line voltage is applied to a first word line selected from the word lines. Recovery voltages are applied to the word lines. Each recovery voltage is applied to at least one corresponding word line of the word lines. The recovery voltages have different voltage levels from each other.

According to an exemplary embodiment of the present inventive concept, a method of operating a nonvolatile memory device is provided as follows. An operation request is received. A first memory block is selected from memory blocks in response to the operation request. Bias voltages are applied to a second memory block. The first memory block and the second memory block share a block word line.

According to an exemplary embodiment of the present inventive concept, a nonvolatile memory device is provided as follows. Memory blocks include first and second memory blocks. The first and the second memory blocks are activated at the same time using a block address. Each memory block includes word lines. A source line driver, in response to a row address, applies a selection word line voltage to a first word line selected from the word lines of the first memory block and a non-selection word line voltage to the other word lines of the first memory block and applies a bias voltage to the second memory block.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
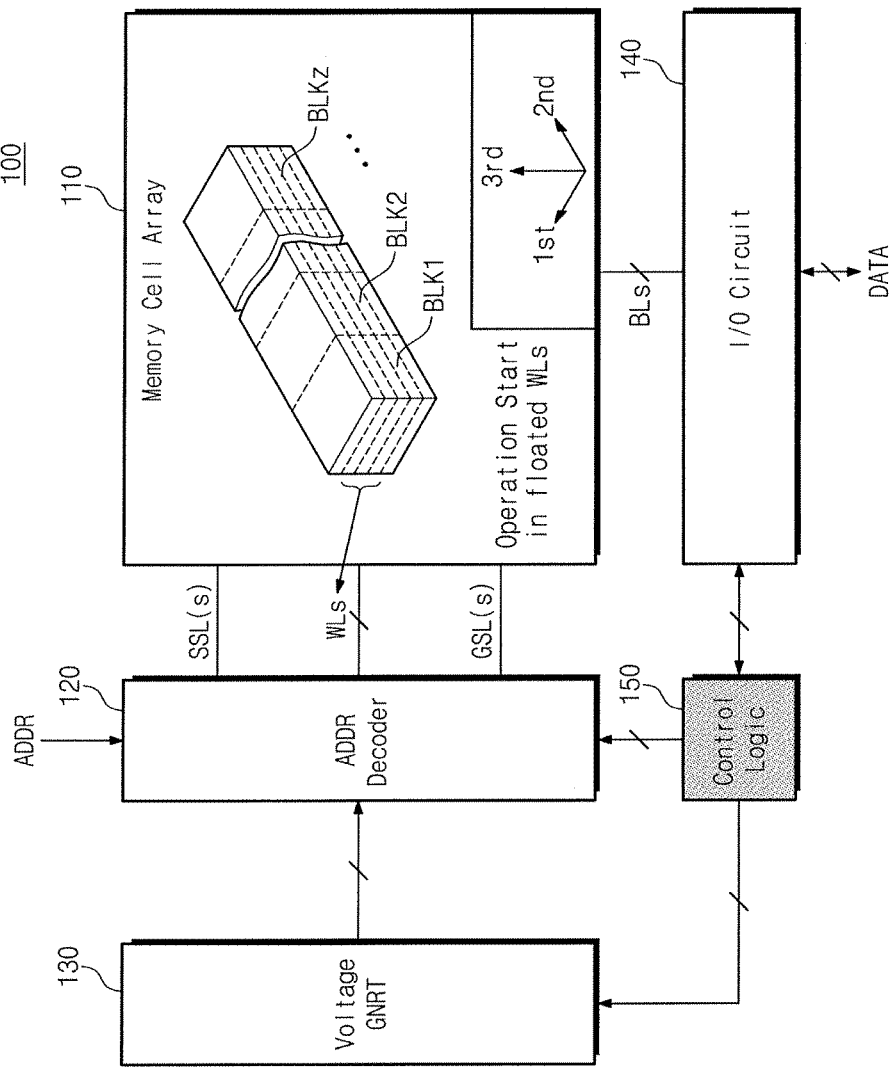
FIG. 1 is a block diagram of a non-volatile memory device according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIG. 1 is a block diagram of a non-volatile memory device 100 according to an exemplary embodiment of the inventive concept. Referring to FIG. 1, the non-volatile memory device 100 may include a memory cell array 110, an address decoder 120, a voltage generating circuit 130, an input/output circuit 140, and control logic 150.

The non-volatile memory device 100 may be a NAND flash memory, a vertical NAND flash memory, a NOR Flash Memory, a resistive random access memory RRAM, a phase-change memory (PRAM), a magneto resistive random access memory (MRAM), a ferroelectric random access memory (FRAM), a spin transfer torque magnetic random access memory (STT-MRAM), or the like. In addition, the non-volatile memory device 100 may be implemented in a three-dimensional array structure. The inventive concept may be applicable to a charge trap flash (CTF), which has an insulation layer as a charge storage layer, as well as a flash memory device which has a charge storage layer made of a conductive floating gate. Hereinafter, for the convenience of description, it is assumed that the non-volatile memory device 100 is a vertical, three-dimensional (3D) NAND flash memory device VNAND.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. In an embodiment of the present inventive concept, the 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

A memory cell array 110 may include a plurality of memory blocks BLK1 to BLKz. The memory blocks BLK1 to BLKz may be connected to the address decoder 120 through word lines WLs, at least one string selection line SSL, and at least one ground select line GSL and may be connected to an input/output circuit 140 through bit lines BLs. In an embodiment of the inventive concept, the word lines WLs may be formed to have a stacked plate structure.

Each of the memory blocks BLK1 to BLKz may include a plurality of strings arranged along a first direction and a second direction (different from the first direction) and along a third direction (perpendicular to a plane defined by the first direction and the second direction) on a substrate to have a three-dimensional structure. The strings of three-dimensional structures may be formed monolithically to one or more of the physical layers of the memory cell arrays having an active region on a silicone substrate and a circuit related to an operation of the memory cells. The circuit related to the operation of the memory cells may be located inside/on the substrate.

Here, each of the strings may include at least one string selection transistor connected in series between a bit line and a common source line CSL, a plurality of memory cells, at least one of the ground select transistors. Here, each of the memory cells may store at least one bit. In an exemplary embodiment, at least one dummy cell may be included between at least one string selection transistor and a plurality of memory cells. In an exemplary embodiment, at least one dummy cell may be included between a plurality of memory cells and at least one ground selection transistor. In an exemplary embodiment, the memory cells may include a charge trap layer.

The address decoder 120 may select one of a plurality of memory blocks BLK1 to BLKz in response to an address. In addition, the address decoder 120 may be coupled to the memory cell array 110 through the word lines WLs, at least one string selection line SSL and at least one ground selection line GSL. The address decoder 120 may select a word line WLs, a string selection line SSL, and a ground selection line GSL using a decoded row address. In addition, the address decoder 120 may decode a column address of the inputted addresses. Here, a decoded column address may be transmitted to the input/output circuit 140. In an exemplary embodiment of the inventive concept, the address decoder 120 may include a row decoder, a column decoder, an address buffer, and the like.

The voltage generating circuit 130 may generate voltages (e.g., a program voltage, a pass voltage, a read voltage, a read pass voltage, a verify voltage, an erase voltage, a common source line voltage, a well voltage, and the like) required for operations. The voltage generating circuit 130 may generate a word line voltage Vwl required for a program, a read, or an erase operation.

In addition, the voltage generating circuit 130 may generate a word line voltage having an offset pulse or a word line voltage having an offset-free pulse under a control of the control logic 150. For example, the voltage generating circuit 130, in response to the control of the control logic 150, may generate a word line voltage Vwl having an offset pulse or having an offset-free pulse.

The input/output circuit 140 may be coupled to the memory cell array 110 through the bit lines BLs. The input/output circuit 140 may receive a decoded column address from the address decoder 120. The input/output circuitry 140 may select the bit lines BLs using a decoded column address.

The input/output circuit 140 may include a plurality of page buffers for storing data to be programmed during a program operation or storing read data during a read operation. Here, each of the page buffers may include a plurality of latches. During a program operation, data stored in the page buffers may be programmed through the bit lines BLs at a page corresponding to a selected memory block. During a read operation, data read through the bit lines BLs from a page corresponding to a selected memory block may be stored at the page buffers. Meanwhile, the input/output circuit 140 may read data from a first region of the memory array cell 110 and may store the read data at a second region of the memory array cell 110. For example, the input/output circuit 140 may be implemented to carry out a copy-back operation.

The control logic 150 may control an operation including, but is not limited thereto, program, read, and erase operations of the non-volatile memory device 100. The control logic 150 may operate, in response to control signals CTRL or a command input from an outside, to initiate an operation on word lines. In an exemplary embodiment, the word lines may be in a floated condition.

At a recovery operation, the control logic 150 may be configured to divide the word lines into a plurality of recovery regions. The control logic 150 may apply one of a plurality of recovery voltages having different voltage levels to the recovery regions.

For example, the recovery operation may be performed to reduce program disturbance and/or read disturbance. For example, the control logic 150 may perform a program recovery operation using a plurality of first recovery voltages on a plurality of first recovery zones. The control logic 150 may perform a read recovery operation using a plurality of second recovery voltages on a plurality of second recovery zones.

According to an exemplary embodiment of the inventive concept, at a recovery operation, the non-volatile memory 100 may reduce program/read disturbance by applying recovery voltages greater than 0V to recovery regions.

The control logic 150 may bias an unselected block adjacent to a selected block on which a program or read operation is performed, with a plurality of bias voltages. For example, the control logic 150 may divide a plurality of word lines of the unselected blocks into a plurality of word line regions. The control logic 150 may prevent negative boosting by biasing the word line regions of an unselected block using the bias voltages, thereby increasing the data reliability of the unselected block.

The control logic 150 may set voltage levels of the bias voltages to different levels according to a location of an unselected block. For example, each voltage level of the bias voltages applied to the unselected block may vary according to a location of a selected block.

Figure 2:
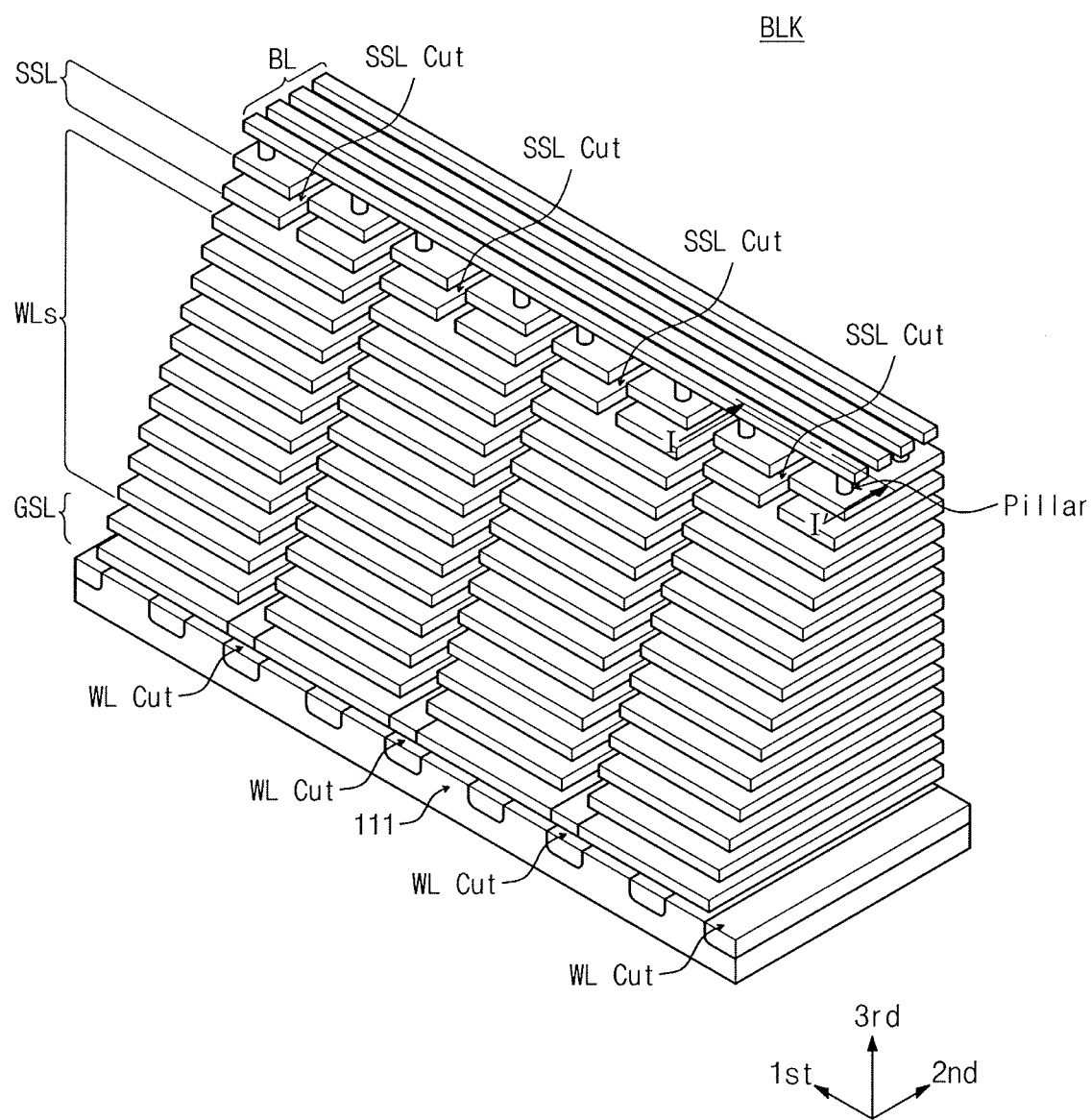
FIG. 2 is a diagram illustrating a memory block of FIG. 1.

FIG. 2 is a diagram illustrating a memory block shown in FIG. 1. Referring to FIG. 2, four sub-blocks may be formed on a substrate 111. Each of the sub-blocks may be formed by stacking, in plate structure, at least one ground selection line GSL, a plurality of word lines WLs and at least one string selection line SSL on a substrate and forming word line cuts WL Cuts.

Here, the string selection line SSL may be separated by a string selection line SSL cut.

In an exemplary embodiment, at least one dummy word line may be stacked in plate form between a ground selection line GSL and a lowermost word line of the word lines WLs or may be stacked in plate structure between an uppermost word line of the word lines WLs and a string selection line SSL.

A common source line CSL, although not illustrated, may be connected in common among the four sub-blocks. For example, the word line cuts WL Cut need not cut through the common source line CSL. A string may be formed by making a pillar connected to the bit line. The pillar may penetrate at least one ground selection line GSL, a plurality of word lines WLs and at least one string selection line SSL.

In FIG. 2, a structure between word line cuts may be illustrated as being a sub block, but the present inventive concept is not limited thereto. For example, a sub-block may be defined by a word line cut and a string selection line cut. In this case, two sub-blocks may be formed between two adjacent word line cuts WL Cut.

According to an exemplary embodiment of the inventive concept, the block BLK may be implemented to have a structure in which two word lines are merged to one word line, for example, a merged word line structure.

Figure 3:
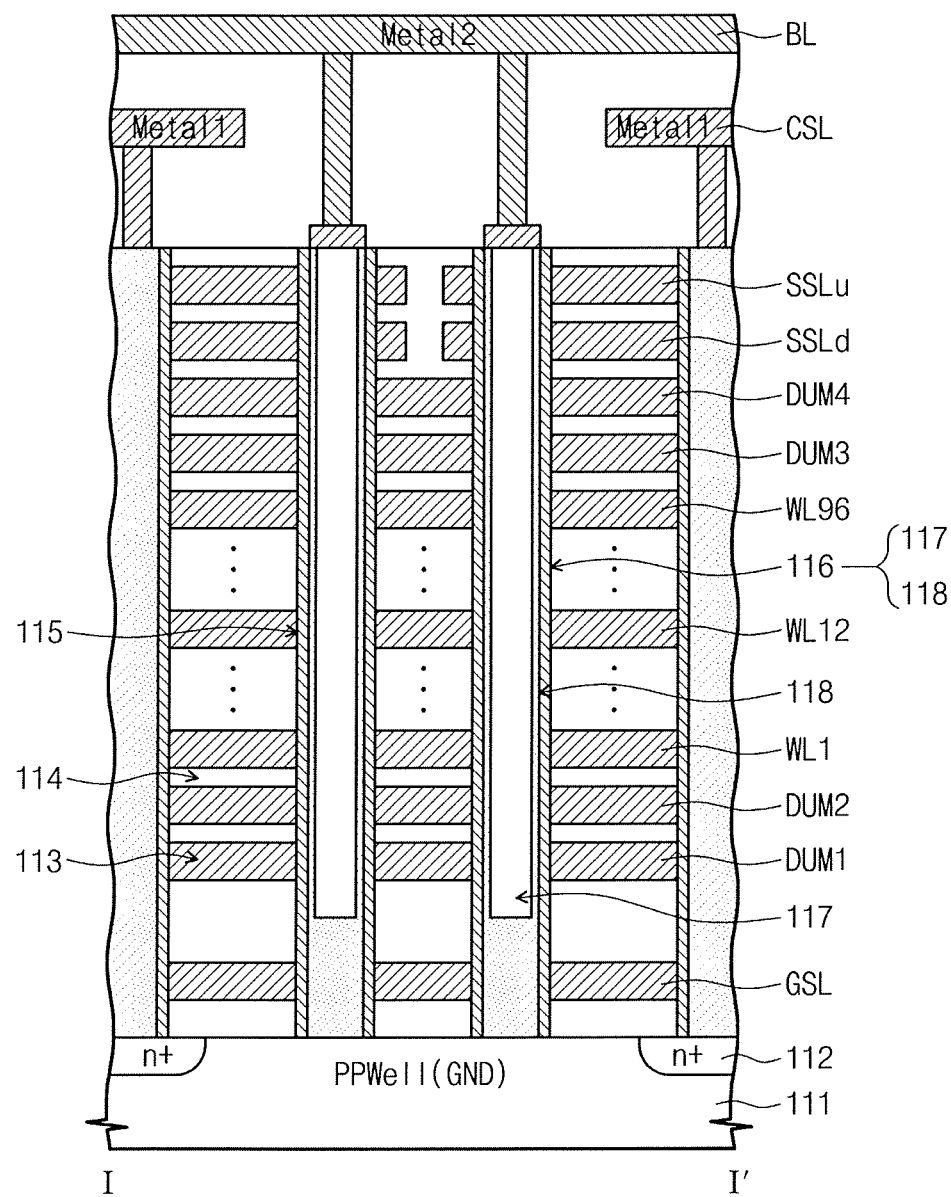
FIG. 3 is a cross-sectional view taken along line I-I' of FIG. 2.

FIG. 3 is a cross-sectional view taken along line I-I' of FIG. 2. Referring to FIG. 3, a memory block BLK may be formed in a direction perpendicular to a substrate 111. An n+ doped region 112 may be formed in the substrate 111.

A gate electrode layer 113 and an insulation layer 114 may be deposited on the substrate 111 in an alternating fashion. In an exemplary embodiment, an information storage layer may be formed on sides of the gate electrode layer 113 and the insulating layer 114.

The gate electrode layers 113 may be connected to a ground selection line GSL, a plurality of word lines WL1 to WL8 and a string selection line SSL, respectively.

The information storage layer 115 may be formed of a tunnel insulation layer, a charge storage layer and a blocking insulation layer. The tunnel insulation layer may operate as an insulation layer through which charges moves by tunneling. The charge storage layer may be formed of an insulation layer in which charges are trapped. The charge storage layer may be formed, for example, of silicon nitride SiN or metal (aluminum or hafnium) oxide. The blocking insulation layer may operate as an insulation layer between the gate electrode layer and the charge storage layer. The blocking insulation layer may be formed of silicon oxide. Here, the tunnel insulation layer, the charge storage layer and the blocking insulation layer may form an insulation layer of an oxide-nitride-oxide (ONO) structure.

A pillar 116 may be formed by patterning the gate electrode layer 113 and the insulating layer 114 in a vertical direction.

The pillar 116 may be connected between a bit line and the substrate 111 through the gate electrode layer 113 and the insulating layer 114. The pillar 116 may include a filling dielectric pattern 117 and a vertical active pattern 118. For example, the inside of the pillar 116 may be formed of an insulation material, such as silicon oxide, or an air gap as a filling dielectric pattern 117. The outside of the pillar 116 may be formed of a semiconductor material as a vertical active pattern 118 which serve as a channel region for a current path. In an exemplary embodiment, the vertical active pattern 118 may be formed of a P-type silicon layer. One memory cell included in the string may be formed of the filling dielectric pattern 117, the vertical active pattern 118, the information storage layer 115 and the gate electrode layer 113 sequentially arranged from the inside of the pillar 116.

A common source line CSL may be disposed on the n+ doped region 112. The common source line CSL may be included in the inside of the word line cut in the form of wall.

Figure 4:
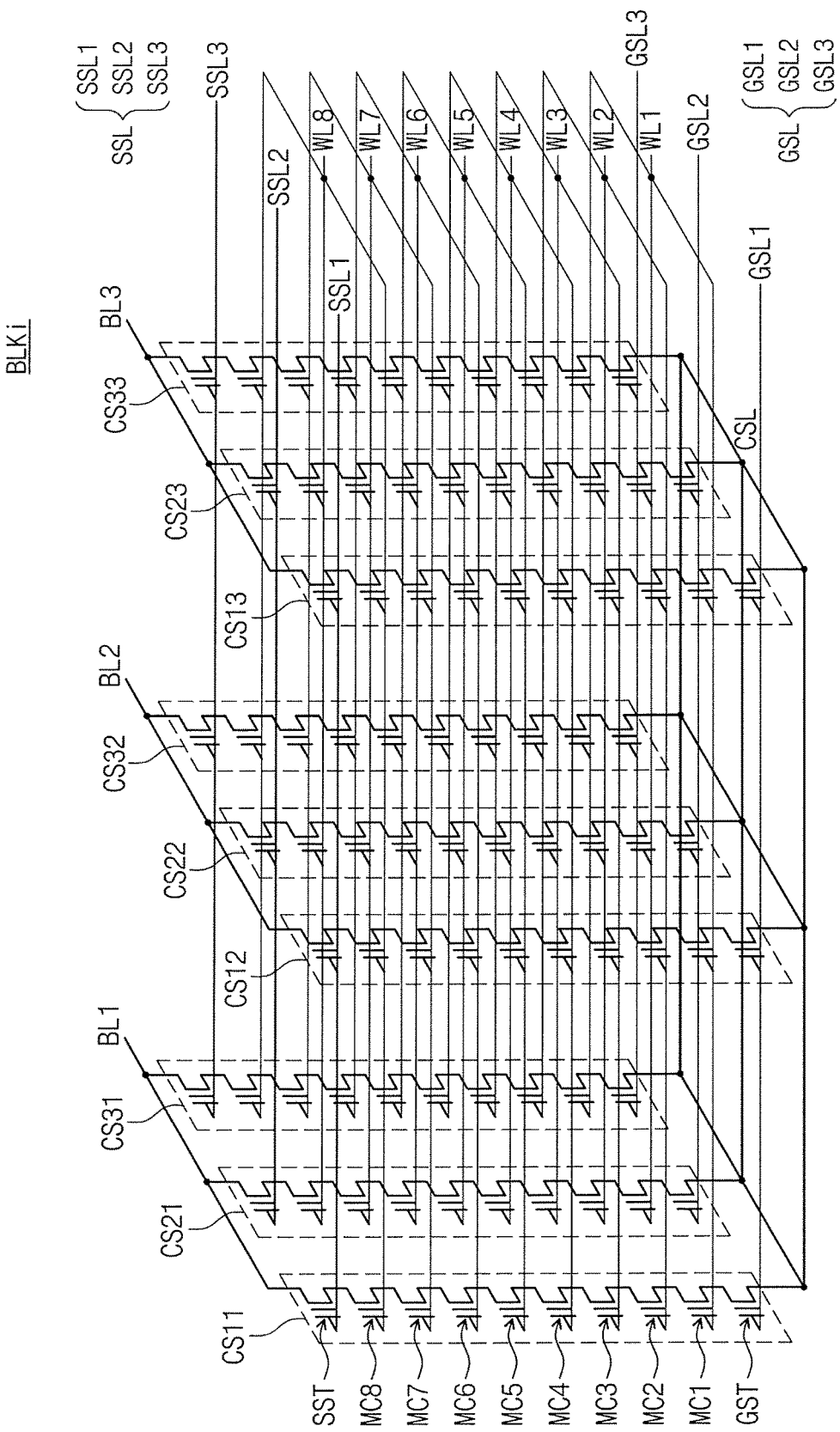
FIG. 4 is a diagram illustrating an equivalent circuit of the memory block of FIG. 2.

FIG. 4 is a diagram illustrating an equivalent circuit of the memory block of FIG. 2. Referring to FIG. 4, cell strings CS11 to CS33 may be connected between bit lines BL1 to BL3 and a common source line CSL. Each cell string (e.g., CS11) may include a ground selection transistor GST, a plurality of memory cells MC1 to MC8 and a string selection transistor SST. In FIG. 4, for the convenience of description, it is assumed that the number of memory cells included in the string is 8. However, the present inventive concept is not limited thereto.

A string selection transistor SST may be connected to a string selection line SSL. The string selection line SSL may be divided into first to third string selection lines SSL1 to SSL3. In FIG. 4, three string selection lines SSL1 to SSL3 may be illustrated as corresponding to one bit line. However, the present inventive concept is not limited thereto. According to an exemplary embodiment of the inventive concept, a memory block BLK may include at least two string selection lines corresponding to a bit line.

The ground selection line GSL of each cell string may be connected to the ground selection transistor GST. The string selection transistor SST may be connected to the bit line BL and the ground selection transistor GST may be connected to the common source line CSL. In an exemplary embodiment, the ground selection line GSL may include three ground selection lines GSL1 to GLS3.

A plurality of memory cells MC1 to MC8 may be respectively connected to corresponding word lines WL1 to WL8. A set of memory cells that are connected to a common word line and are programmed or read at a time may be referred to as a page. A memory block BLKi may include a plurality of pages. In addition, one word line may be connected with a plurality of pages. Referring to FIG. 4, a word line (e.g., WL4) may be connected in common to three pages.

On the other hand, each memory cell may store one bit of data or two or more bits of data. A memory cell in which one bit of data is stored may be called a single level cell (SLC) or a single bit cell. A memory cell in which two or more bits of data are stored may be called a multi-level cell (MLC) or a multi-bit cell. For a two-bit MLC, two pages of data may be stored in one physical page. Thus, six pages of data may be stored in memory cells connected to a fourth word line WL4.

The non-volatile memory device 100 may be implemented with a charge trap flash (CTF) memory cell. The nonvolatile memory device 100 may experience an initial verify shift (IVS) in which charges trapped in a programmed CTF memory cell are redistributed and lost with the lapse of time. Reprogramming may be performed to overcome the degradation of a threshold voltage distribution of the CTF memory cell.

The ground selection line GSL of the memory block BLK illustrated in FIG. 4 may be separated into three ground selection lines GSL1 to GSL3. However, the present inventive concept is not limited thereto. In an exemplary embodiment, the separated ground selection lines GSL1 to GSL3 are independently biased. In an exemplary embodiment, the ground selection line GSL of the inventive concept may be implemented to have a shared structure. In this case, the ground selection line GSL may be commonly biased.

Figure 5:
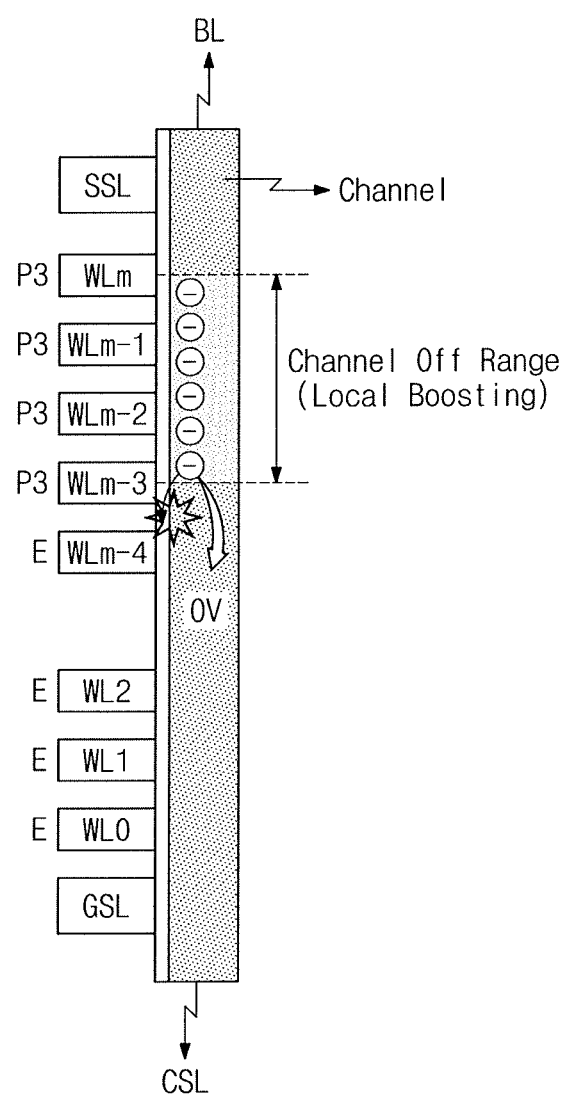
FIG. 5 is a diagram for explaining a hot carrier injection (HCI) conceptually.

FIG. 5 is a diagram for explaining hot carrier injection (HCI) conceptually. In FIG. 5, for the convenience of description, it is assumed that memory cells connected to a selected word line WLm-3 and upper word lines WLm, WLm-1 and WLm-2 of the selected word line WLm-3 are programmed into the uppermost state P3. In this case, a channel-off region (or a local boosting region) may be formed at a channel of a string corresponding to the memory cells connected to the selected word lines WLm-3 and the upper word lines WLm, WLm-1 and WLm-2.

Upon performing a recovery operation after the program or read operation, a conventional non-volatile memory device may discharge voltages of the upper word lines WLm, WLm-1 and WLm-2 from a program pass voltage Vpass or a read pass voltage Vread to a ground voltage GND. Accordingly, charges in the channel-off region may suffer negative down coupling, which is called "negative boosting" or "under coupling". Eventually, more negative charges may exist at the channel-off period.

However, since a channel is turned off, it may be impossible to discharge negative charges thus increased. At this time, a voltage of the channel-off region may be a negative voltage by the "under boosting", and channel voltages corresponding to the memory cells connected to lower word lines WLm-4 to WL0 of the selected word line WLn-3 may be a ground voltage GND (e.g. 0V) because connected to the common source line CSL. At this time, a voltage of the channel-off interval may become a negative voltage. As a voltage difference between the negative voltage and a ground voltage increases, a memory cell, having an eased state, of the word line WLm-4 may be programmed by band-to-band tunneling (BTBT) or hot carrier injection (HCI). That is, program and read disturbance may be caused. As a read voltage becomes higher and program and read operations are repeated, the program and read disturbance may be increased.

To reduce the program and read disturbance, a recovery voltage Vrcv may be applied to the word lines WL1 to WLm. The hot carrier injection HCI may be reduced as the recovery voltage Vrcv applied to the word lines WL1 to WLm increases. However, as the recovery voltage Vrcv increases, the disturbance may increase due to the FN tunneling.

The amount of disturbance caused by the HCI and amount of disturbance caused by the FN tunneling may be different among word lines. Thus, in an exemplary embodiment of the inventive concept, the word lines WL1 to WLm may be divided into a plurality of recovery regions considering the relative amount of the disturbances caused by the HCI and the FN tunneling, and a plurality of recovery voltages may be applied to the recovery regions, respectively.

Figure 6:
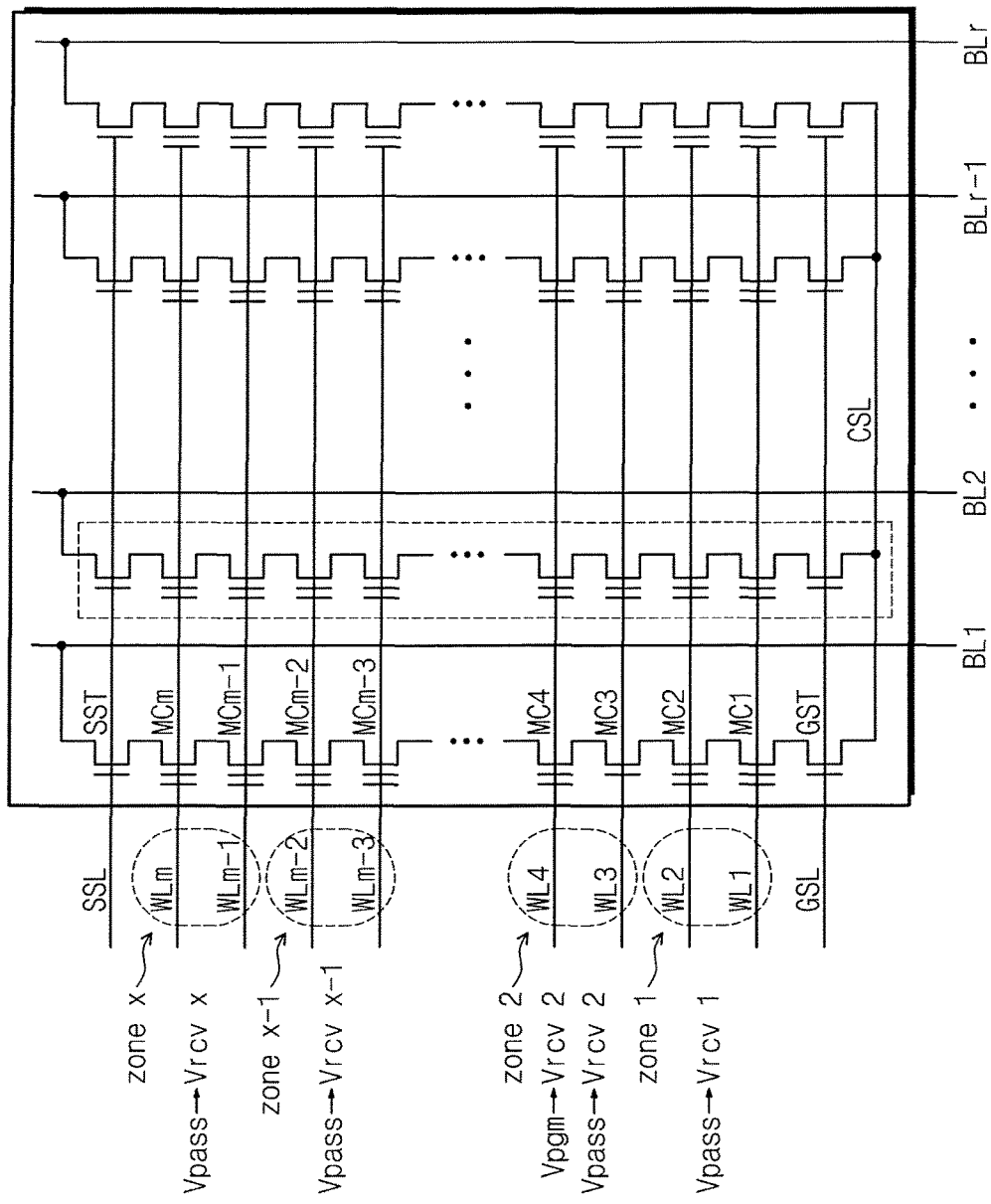
FIG. 6 is a diagram for explaining a recovery operation to reduce program disturbance, according to an exemplary embodiment of the present inventive concept.

FIG. 6 is a diagram for explaining a recovery operation for reducing program disturbance, according to an exemplary embodiment of the inventive concept. Referring to FIG. 6, a memory block BLK may include a plurality of strings respectively connected to a plurality of bit lines BL1 to BLr (r being an integer of 2 or more). Each string may include at least one string selection transistor SST, a plurality of memory cells MC1 to MCm (m being an integer of 2 or greater) and at least one ground selection transistor GST. Each of the memory cells MC1 to MCm may store one or more data bits. A memory block is an operation unit for a erasing operation. For example, memory cells with the memory block may be erased at the same time in a erasing operation.

In FIG. 6, for the convenience of description, it is assumed that memory cells connected to a fourth word line WL4 are programmed. During a program operation, a program voltage Vpgm may be applied to the fourth word line WL4. A pass voltage Vpass may be applied to remaining, unselected word lines WL1 to WL3 and WL5 to WLm other than the selected fourth word line WL4.

During a recovery operation, the word lines WL1 to WLm may be divided into a plurality of first recovery regions zone 1 to zone x. First recovery voltages Vrcv 1 to Vrcv x may be applied to the first recovery regions zone 1 to zone x, respectively. The first recovery voltages Vrcv 1 to Vrcv x may be voltages set to reduce the disturbance caused by HCI and FN-tunneling.

For example, the greater the program disturbance of the first recovery regions zones 1 to zone x, the greater the first recovery voltages Vrcv 1 to Vrcv x. However, the present inventive concept is not limited thereto. In an exemplary embodiment, the greater the read disturbance of the first word line regions zone 1 to zone x, the smaller the first recovery voltages Vrcv 1 to Vrcv x.

For example, voltage levels of the first recovery voltages Vrcv 1 to Vrcv x may vary according to an incremental step pulse programming (ISPP) method.

Figure 7:
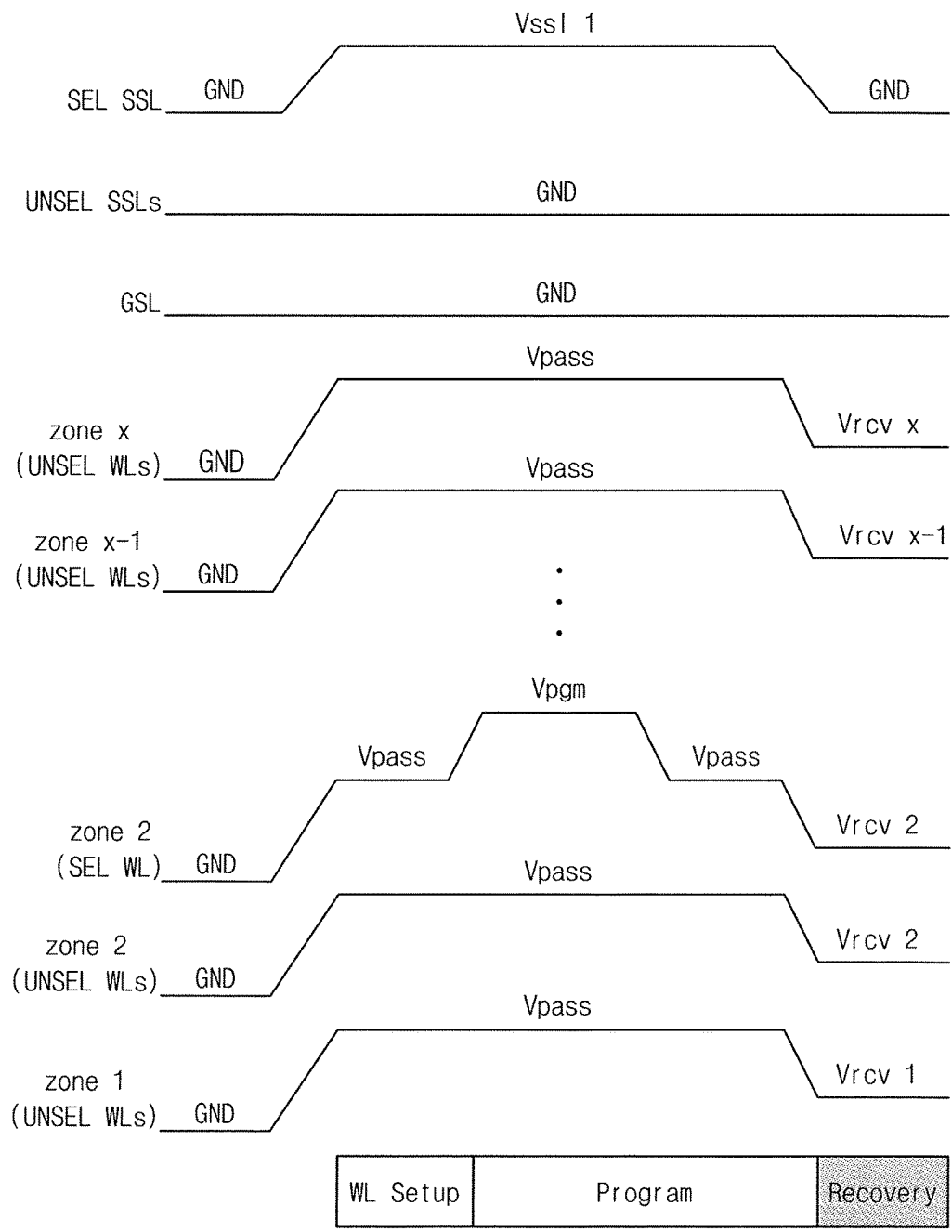
FIG. 7 is a timing diagram illustrating a program operation according to an exemplary embodiment of the present inventive concept.

FIG. 7 is a timing diagram illustrating a program operation according to an exemplary embodiment of the inventive concept. Referring to FIGS. 6 and 7, a program operation may be divided into a word line setup period, a program period, and a recovery period.

At the word line setup period, a pass voltage Vpass may be applied to all word lines WLs of first word line regions zone 1 to zone x. In an exemplary embodiment, during the word line setup period, a first string selection voltage Vssl1 may be applied to a selected string selection line, a ground voltage GND may be applied to unselected string selection lines and a ground selection line GSL.

During the program period, a program voltage Vpgm may be applied to a selected word line for a predetermined time. The pass voltage Vpass may be applied again to the selected word line after the program voltage Vpgm is applied to the selected word line and the predetermined time elapses.

During the recovery period, the recovery voltages Vrcv 1 to Vrcv x may be applied to the first recovery regions zone 1 to zone x, respectively. For example, the first recovery voltage Vrcv 1 to Vrcv x with different voltage levels may be applied to the first recovery regions zone 1 to zone x, respectively.

In FIG. 7, during the recovery period, string/ground selection lines and word lines may be discharged at substantially the same time. However, the present inventive concept is not limited thereto. For example, the string/ground selection lines may start to be discharged after the word lines start to be discharged.

Figure 8:
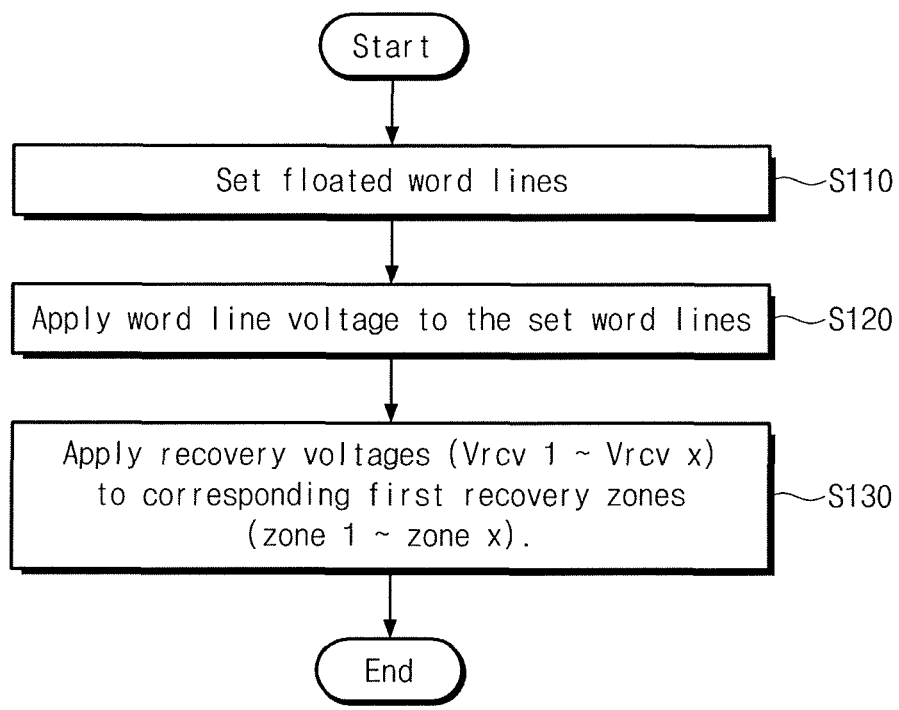
FIG. 8 is a flow chart illustrating a program method of a nonvolatile memory device according to an exemplary embodiment of the present inventive concept.

FIG. 8 is a flow chart illustrating a program method of a nonvolatile memory device according to an exemplary embodiment of the inventive concept. Referring to FIGS. 6 to 8, in step S110, floated word lines may be set. The word lines WLs may be floated before an operation command is received from the outside. During a program operation, the floated word lines WLs may be set with the program pass voltage. In step S120, the word line voltages (e.g., a program voltage or a program verify voltage) may be applied to the set word lines WLs. In step S130, the word lines may be divided into a plurality of first recovery regions zone 1 to zone x, and a plurality of first recovery voltages Vrcv 1 to Vrcv x may be applied to the first recovery regions zone 1 to zone x, respectively.

Figure 9:
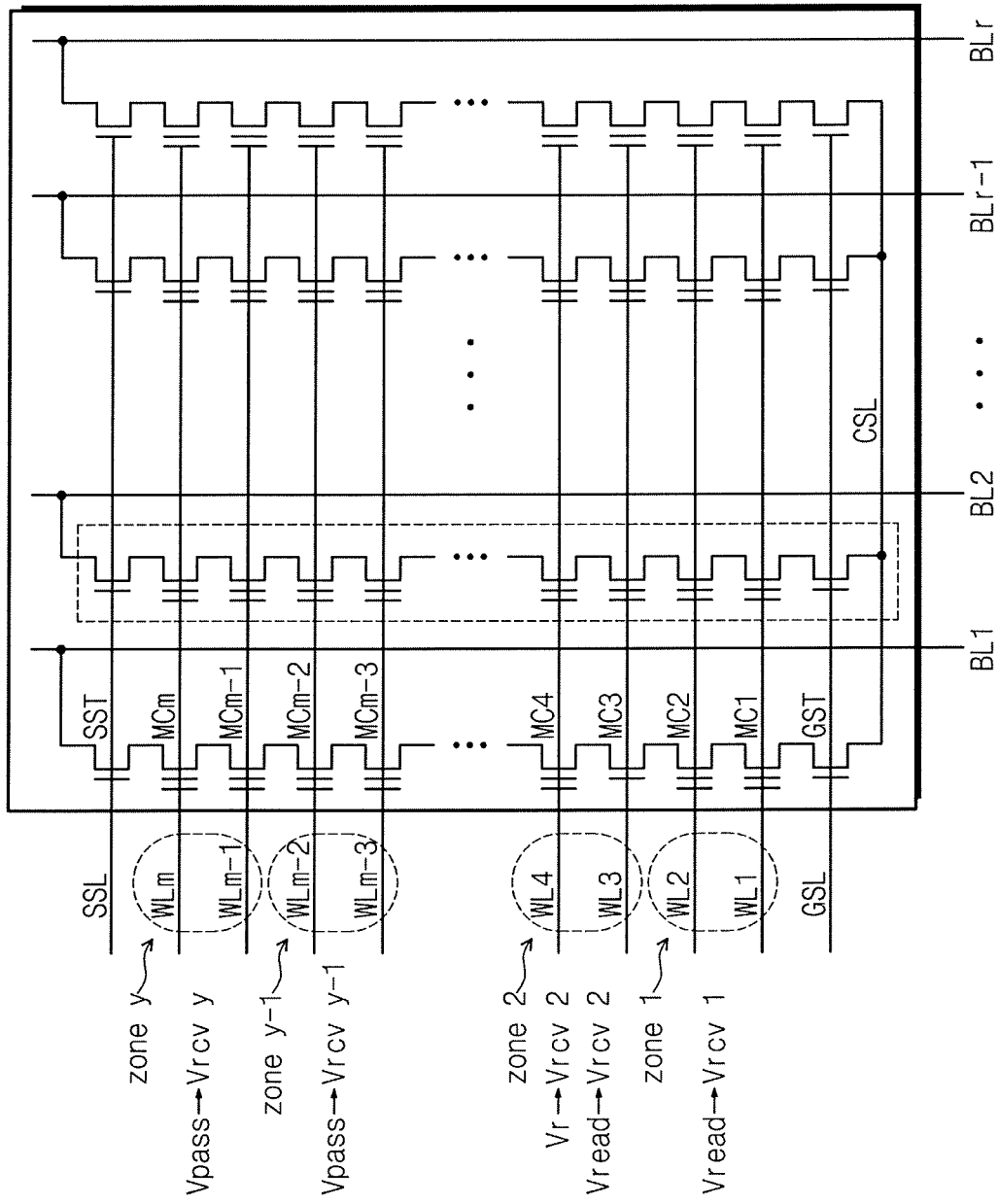
FIG. 9 is a diagram for explaining a recovery operation to reduce a read disturbance, according to an exemplary embodiment of the present inventive concept.

FIG. 9 is a diagram showing a recovery operation for reducing read disturbance, according to an exemplary embodiment of the inventive concept. In FIG. 9, for the convenience of description, it may be assumed that a fourth word line WL4 is selected to read memory cells connected to the fourth word line WL4. During a read operation, a read voltage Vread may be applied to the fourth word line WL4 selected for the read operation, and a read pass voltage Vread may be applied to remaining, unselected word lines WL1 to WL3 and WL5 to WLm other than the fourth word line WL4.

At a recovery operation, the word lines WL1 to WLm may be divided into second recovery regions zone 1 to zone y. Second recovery voltages Vrcv 1 to Vrcv y having different voltage levels from each other may be applied to the second recovery regions zone 1 to zone y, respectively. The second recovery voltages Vrcv 1 to Vrcv y may be voltages set to reduce the disturbance caused by HCI and FN tunneling.

For example, as read disturbance of the second word line regions zone 1 to zone y increases, the second recovery voltages Vrcv 1 to Vrcv y may increase. However, the present inventive concept is not limited thereto. As the read disturbance of the second word line regions zone 1 to zone y increases, the second recovery voltages Vrcv 1 to Vrcv y may decrease.

Referring to FIGS. 6 and 9, first recovery regions zone 1 to zone x and second recovery regions zone 1 to zone y may be the same. However, the present inventive concept is not be limited thereto. During a program operation and a read operation, the first recovery regions zone 1 to zone x and the second recovery regions zone 1 to zone y may be differently set according to the disturbance due to the HCI and FN tunneling.

Figure 10:
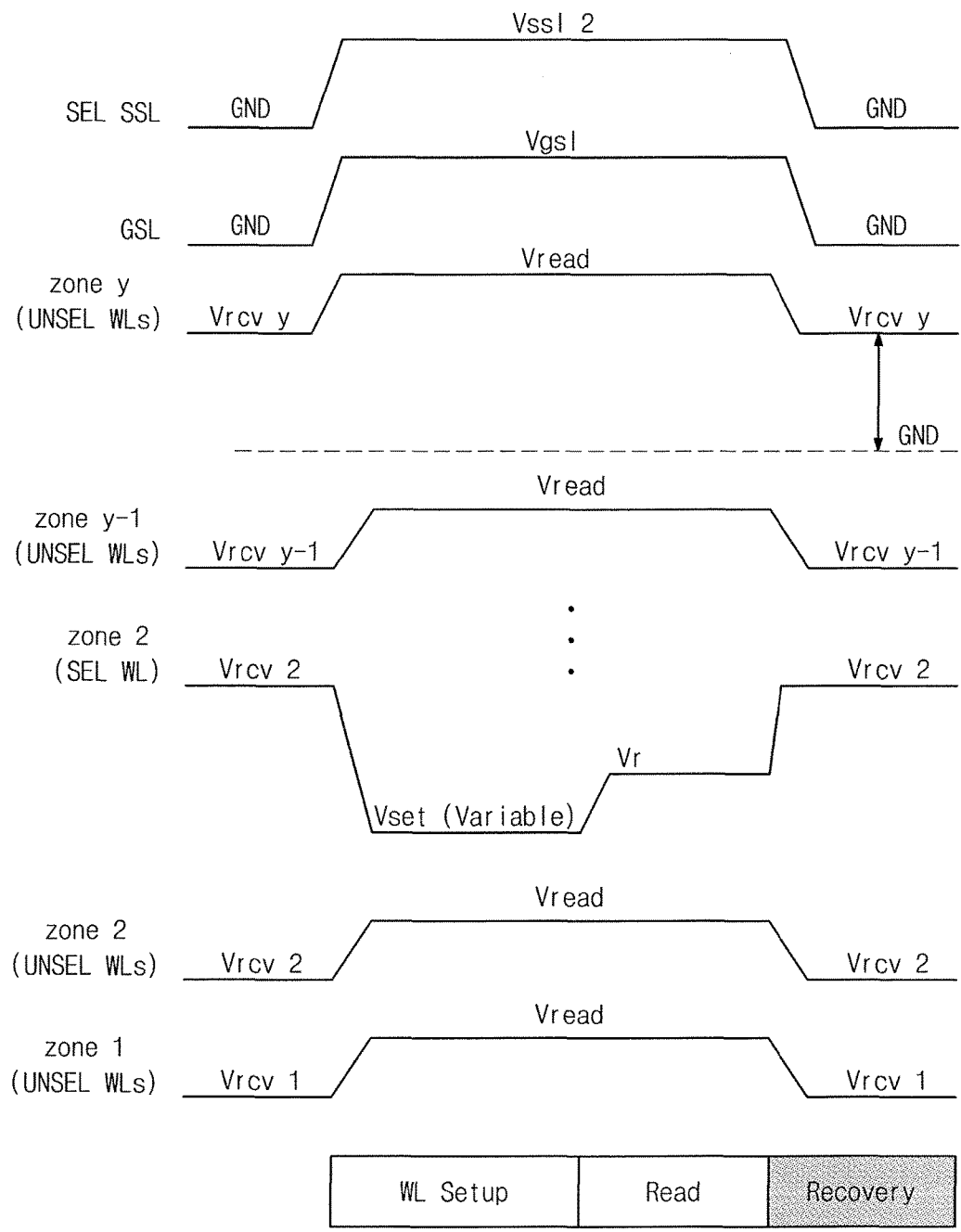
FIG. 10 is a timing chart illustrating a read operation according to an exemplary embodiment of the present inventive concept.

FIG. 10 is a timing diagram illustrating a read operation according an exemplary embodiment of the inventive concept. Referring to FIGS. 9 and 10, a read operation may be divided into a word line setup period, a read period, and a recovery period.

At the word line setup period, a word line setup voltage Vset may be applied to a selected word line SEL WL and a read pass voltage Vread may be applied to unselected word lines UNSEL WLs. Here, before the word line setup period, second recovery voltages Vrcv 1 to Vrcv y may be applied to second recovery regions zone 1 to zone y, respectively. In an exemplary embodiment, the word line setup voltage Vset may be fixed. In another embodiment, the word line setup voltage Vset may be varied according to a read voltage Vr.

In an exemplary embodiment, at the word line setup period, a second string selection voltage Vssl 2 may be applied to a selected string selection line SEL SSL, a ground voltage GND may be applied to unselected string selection lines UNSEL SSLs, and a ground selection voltage Vgsl may be applied to a ground selection line GSL.

During the read period, a sensing operation may be performed using the read voltage Vr to determine an ON/OFF of the memory cell. A data bit stored in the memory cell may be determined based on the result of the sensing operation. In an exemplary embodiment, at the read period, the string selection lines and the ground selection line may maintain the state of the word line setup period.

During the recovery period, the second recovery voltages Vrcv 1 to Vrcv y may be applied to the second recovery regions Vrcv 1 to Vrcv y, respectively.

During the recovery period of the read operation illustrated in FIG. 10, the string/ground selection lines and the word lines may be discharged at substantially the same time. However, the present inventive concept is not limited thereto. For example, the string/ground selection lines may start to be discharged after the word lines start to be discharged.

Figure 11:
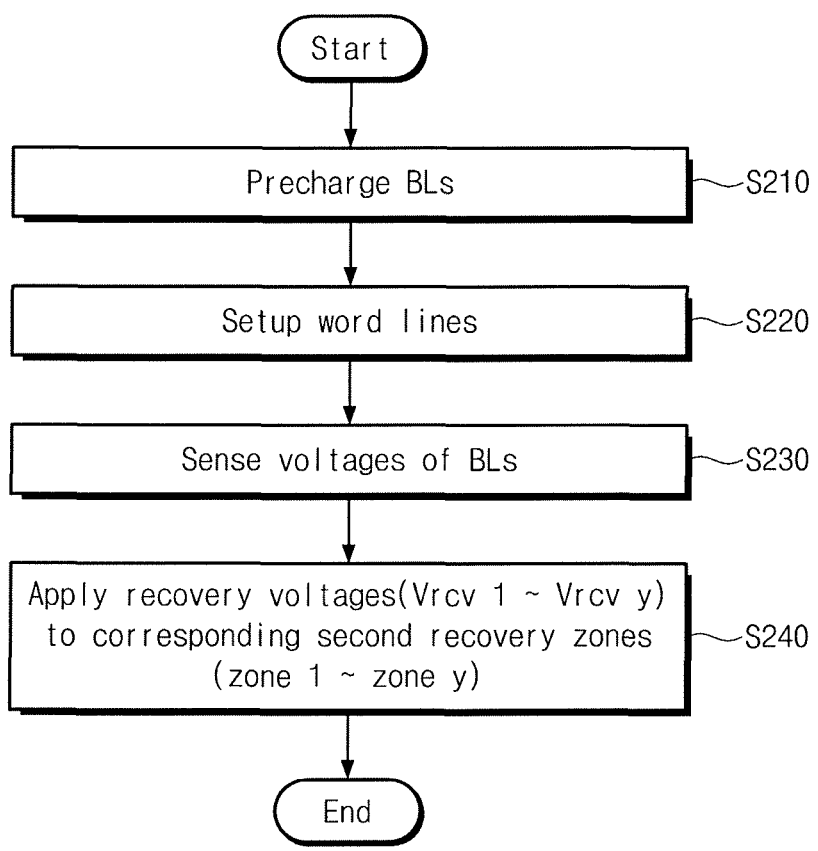
FIG. 11 is a flow chart for a read method of a nonvolatile memory device according to an exemplary embodiment of the present inventive concept.

FIG. 11 is a flow chart for a read method of a nonvolatile memory device according to an exemplary embodiment of the inventive concept. A read method will be described with reference to FIGS. 9 to 11.

In step 210, all bit lines BLs may be pre-charged at a read operation. In step 220, a read voltage Vr may be applied to a selected word line of a floating state, and a read pass voltage Vread may be applied to unselected word lines UNSEL WLs of the floating state.

In step 230, voltages of the bit lines BLs may be sensed during a predetermined time. In step 240, After a sense operation, word lines may be divided into a plurality of the second recovery regions zone 1 to zone y, and second recovery voltages Vrcv 1 to Vrcv y having different voltage levels may be applied to the second recovery regions zone 1 to zone y, respectively. Furthermore, the recovery operation may be performed by discharging voltages of the string/ground selection lines to the ground voltage GND.

In an exemplary embodiment, the second recovery voltages Vrcv 1 to Vrcv y, in a read operation, may be applied to the second recovery regions zone 1 to zone y, respectively, to reduce read disturbance.

Figure 12:
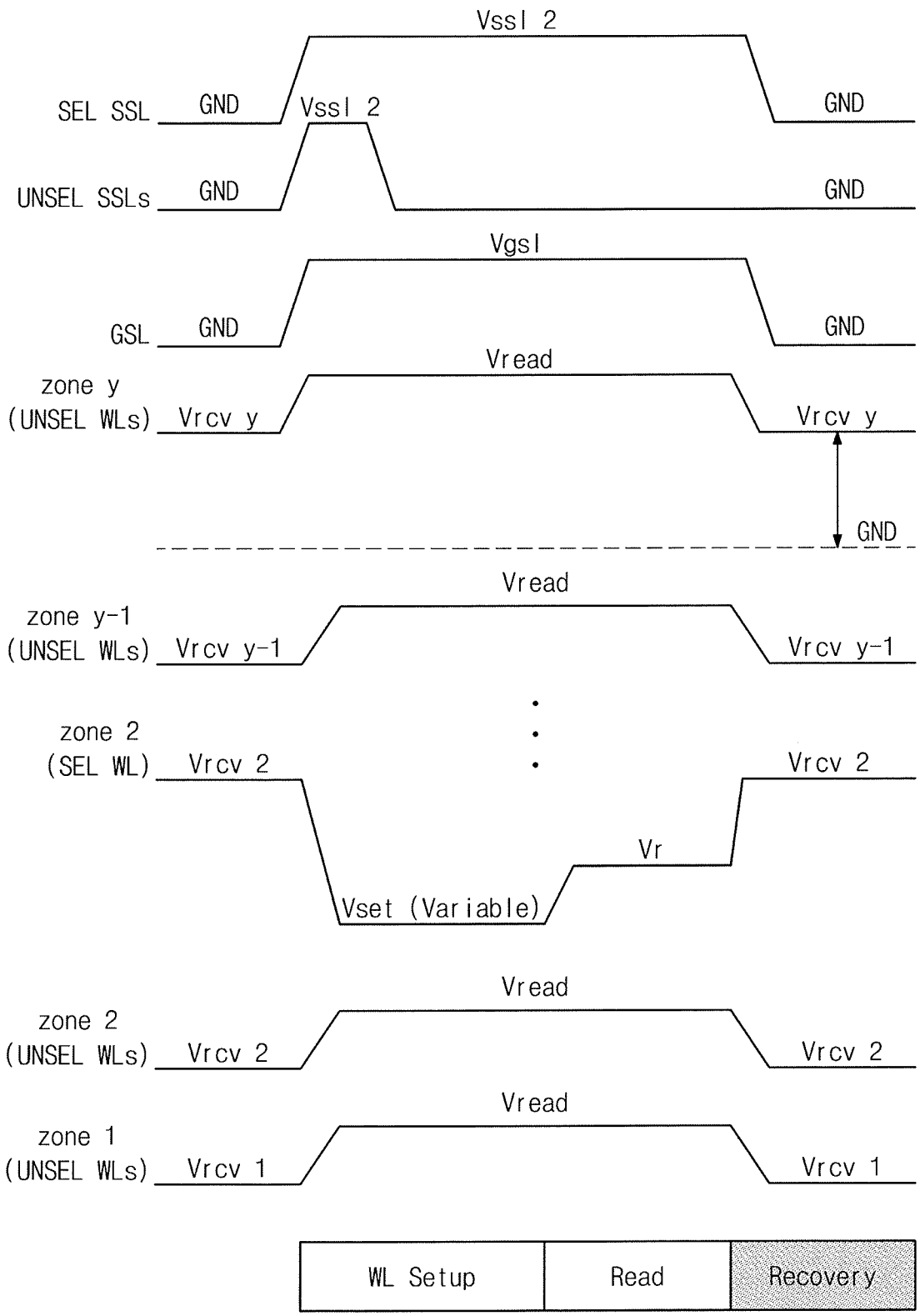
FIG. 12 is a timing chart illustrating a read operation according to an exemplary embodiment of the present inventive concept.

FIG. 12 is a timing chart illustrating a read operation according to an exemplary embodiment of the inventive concept. Referring to FIGS. 9, 10 12, in a word line setup period, a second string selection voltage Vssl 2 may be applied to unselected string selection lines UNSEL SSLs for a predetermined time.

On the other hand, as illustrated in FIG. 12, the second string selection voltage Vssl 2 may be applied to the unselected string selection lines UNSEL SSLs only at the word line setup period. However, the present inventive concept is not limited thereto. In an exemplary embodiment, during a recovery period, the second string selection voltage Vssl 2 may be applied to the unselected string selection lines UNSEL SSLs for the predetermined time.

Figure 13:
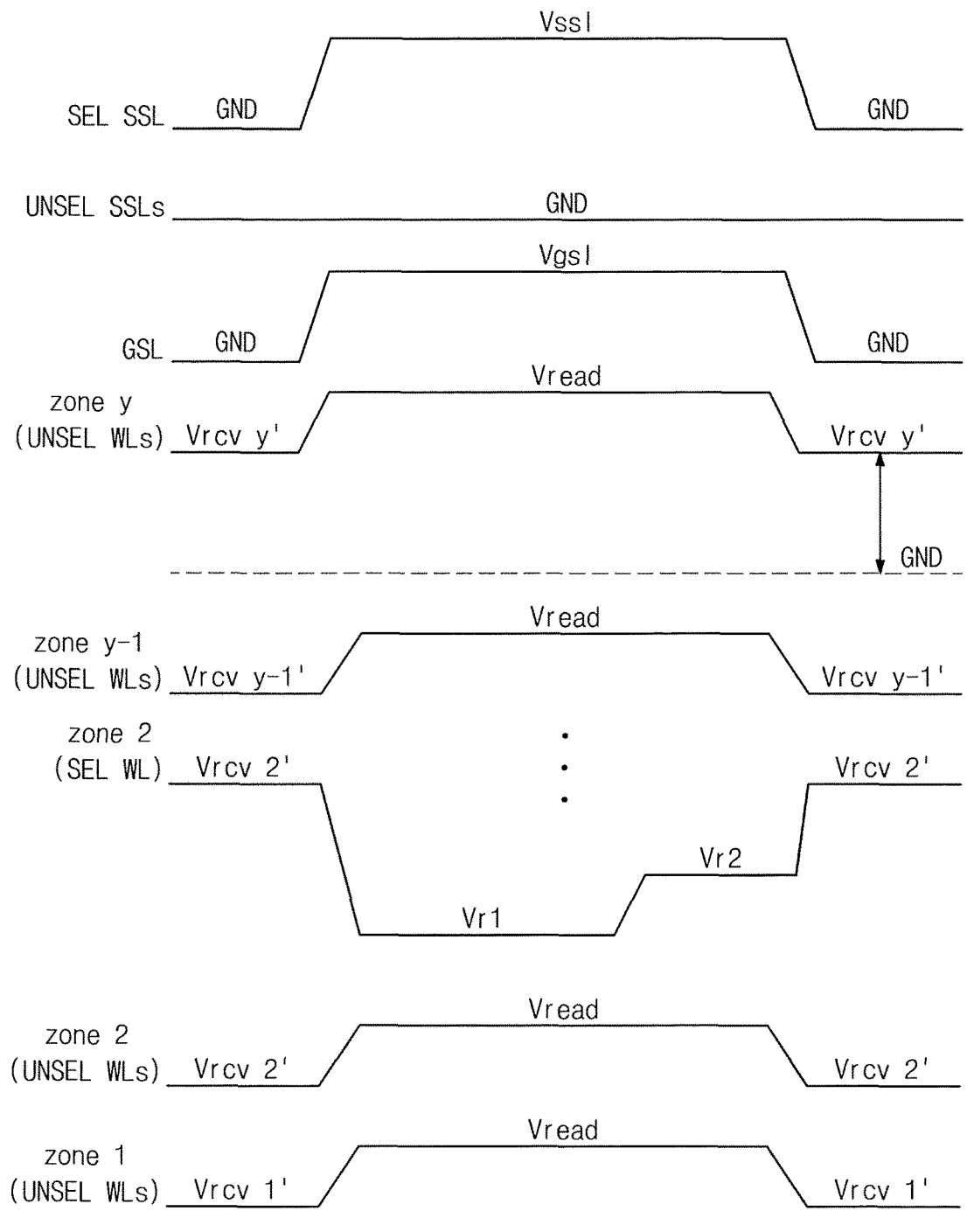
FIG. 13 is a timing chart illustrating a read operation according to an exemplary embodiment of the present inventive concept.

FIG. 13 is a timing chart illustrating a read operation according to an exemplary embodiment of the inventive concept. FIG. 13 is a timing diagram illustrating a read operation for a two-bit memory cell. Referring to FIGS. 9, 10, and 13, during a word line setup period, a first read voltage Vr1 may be applied to a selected word line SEL WL, and a read pass voltage Vread may be applied to unselected word lines UNSEL WLs. In an exemplary embodiment, during the word line setup period, a string selection voltage Vssl may be applied to a selected string selection line SEL SSL. A ground voltage GND may be applied to unselected string selection lines UNSEL SSLs. A ground selection voltage Vgsl may be applied to the ground selection line GSL.

During a first read period, a sensing operation may be carried out using a first read voltage Vr1 to detect an ON/OFF state of a memory cell. In the embodiment, during the first read period, the string selection lines and the ground selection line may maintain states of the word line setup period. The sensing operation may be carried out using a second read voltage Vr2 to detect the ON/OFF state of the memory cell. A data bit stored in the memory cell may be determined according to a result of the sensing operation. In an exemplary embodiment, at the second read period, the string selection lines and the ground selection line may maintain the states of the word line setup period.

During a recovery period, third recovery voltages Vrcv 1' to Vrcv y' may be applied to second recovery regions zone 1 to zone y, respectively.

Referring to FIGS. 11 and 13, second recovery voltages Vrcv 1 to Vrcv y applied to word lines WLs including memory cells (e.g., SLC) each storing one bit may be different from third recovery voltages Vrcv 1' to Vrcv y' applied to word lines WLs including memory cells (e.g., MLC) each storing 2 bits. For example, the third recovery voltages Vrcv 1' to Vrcv y' may be higher than the second recovery voltages Vrcv 1 to Vrcv y. For example, during the recovery period, as the number of bits to be stored at a memory cell increases, the recovery voltage to be applied in the recovery period may increase. However, the present inventive concept is not be limited thereto. The third recovery voltages Vrcv 1' to Vrcv y' may be lower than the second recovery voltages Vrcv 1 to Vrcv y. For example, during the recovery period, as the number of bits to be stored at the memory cell increases, the recovery voltage to be applied in the recovery period may decrease.

Figure 14:
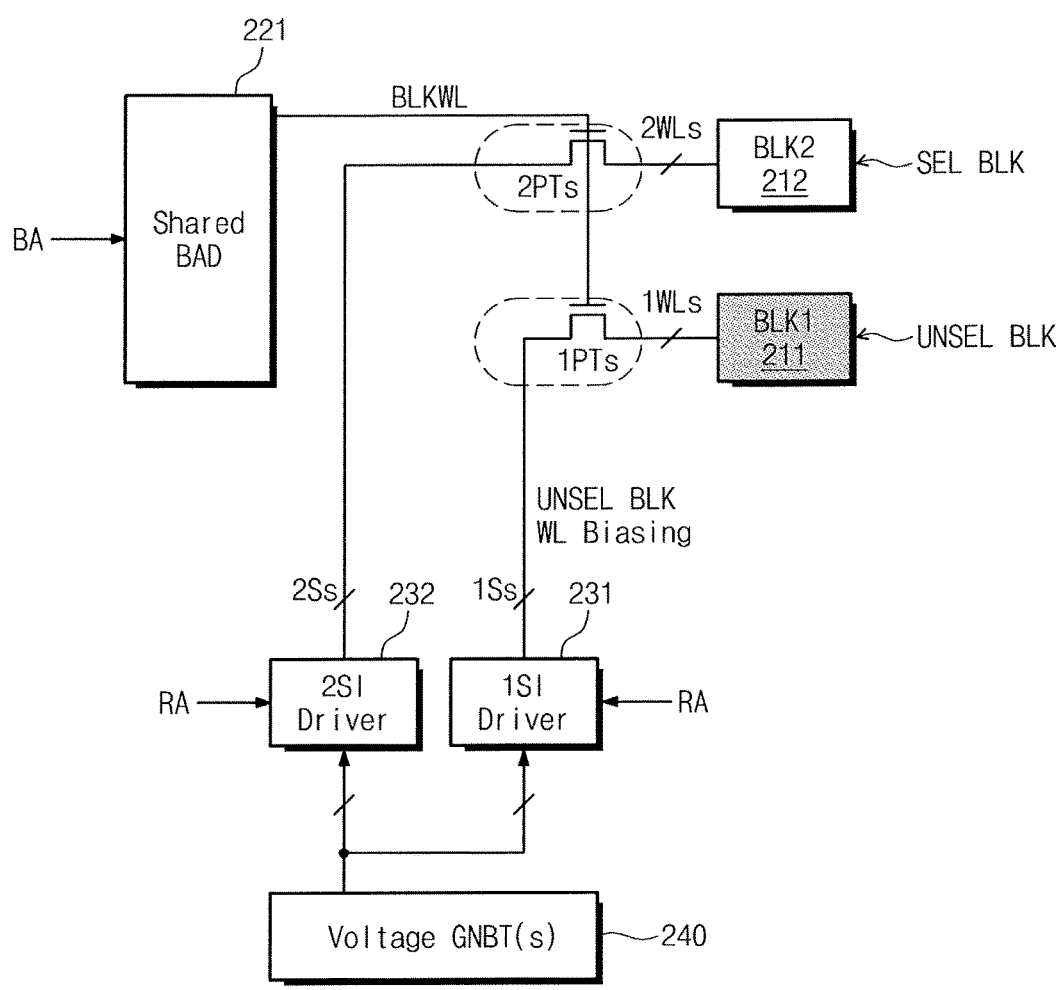
FIG. 14 is a block diagram illustrating a non-volatile memory device according to an exemplary embodiment of the present inventive concept.

FIG. 14 is a block diagram illustrating a non-volatile memory device according to an exemplary embodiment of the inventive concept. Referring to FIG. 14, a nonvolatile memory device 200 may include a first block BLK1 211 and a second block BLK2 212, first and second pass transistors 1PTs and 2PTs, a shared block address decoder 221, first and second source line drivers 231 and 232 and a word line voltage generator 240. A non-volatile memory device 200 of FIG. 14 may include a configuration such as the non-volatile memory device 100 of FIG. 1.

The memory blocks 211 and 212 may include a plurality of memory cells connected to word lines 1WLs and 2WLs, respectively. In an exemplary embodiment, each of memory cells in memory blocks 211 and 212 may store at least one bit, and may be implemented as a floating body structure.

A shared block address decoder 221 may turn on the first and the second pass transistors 1PTs and 2PTs in response to a block address BA. In an exemplary embodiment, the shared block address decoder 221 may include a high-voltage switch(s).

As illustrated in FIG. 14, the first and the second pass transistors 1PTs and 2PTs may connect source lines 1Ss and 2Ss to word lines 1WLs and 2WLs in response to a voltage applied to a block word line BLKWL. In an exemplary embodiment, each of the first and second pass transistors 1PTs and 2PTs may be a high voltage transistor.

The first source line driver 231 may receive word line voltages and may apply first voltages, corresponding to a row address RA from among the word line voltages to first source lines 1Ss, respectively. If the first block 211 is a selected block SEL BLK, the first voltages may include a selection word line voltage and at least one non-selection word line voltage. On the other hand, if the first block 211 is an unselected block UNSEL BLK, the first voltages may be a plurality of bias voltages. In an exemplary embodiment, the row address RA may include the block address BA.

The second source line driver 232 may receive the word line voltages and may apply second voltages, corresponding to the row address RA, from among the word line voltages to second source lines 2Ss, respectively. If a second block 212 is a selected block SEL BLK, the second voltages may include a selection word line voltage and at least one non-selection word line voltage. On the other hand, if the second block 212 is an unselected block UNSEL BLK, the second voltages may be a plurality of bias voltages.

For example, in FIG. 14, the first block 211 may be an unselected block UNSEL BLK corresponding to the row address RA and the second block 212 may be a selected block SEL BLK. At this time, the first source line driver 231 may apply the bias voltages, which are to be applied to first word lines 1WLs of the unselected block 211, to the first source lines 1Ss connected to the first pass transistors 1PTs, and the second source line driver 232 may apply the selection and non-selection word line voltages, which are to be applied at second word lines 2WLs of the selected block 212, to the second source line 2Ss connected to the second transistors 2PTs.

In FIG. 14, the first and the second source line drivers 231 and 232 may be separate from each other. However, the present inventive concept is not limited thereto. The first and the second source line drivers 231 and 232 may be configured with a source line driver. For example, the source line driver may be implemented to supply the selection voltage, non-selection voltages, and the bias voltages corresponding to a row address RA, from among the word line voltages, to the first source lines 1Ss or the second source lines 2Ss.

A word line voltage generator 240 may be implemented to generate voltages required for driving a word line under a control of control logic (not shown). Here, the word line voltages may include a selection word line voltage and a first non-selection word line voltage(s) to be applied to the selected block and the bias voltages to be applied to the unselected block.

For example, the selection word line voltage may include a program voltage, a read voltage, a read verify voltage, an erase voltage, an erase verify voltage, and the like. In addition, the non-selection word line voltage(s) may include a program pass voltage, a read pass voltage and the like. Further, the bias voltages may include a forcing voltage for preventing negative boosting. Here, the negative boosting may mean that channel charges experience negative coupling when a word line voltage is changed suddenly from a positive voltage to a negative voltage.

In general, a non-volatile memory device may apply one negative coupling protection voltage to an unselected block to prevent the negative boosting which is generated in the unselected block. According to an exemplary embodiment of the inventive concept, a non-volatile memory device 200 may apply bias voltages having different levels to a plurality of word line regions, respectively. The word line regions may be divided according to a degree of the negative boosting occurring in each of word lines.

The negative boosting may be prevented by biasing word lines of an unselected block with a plurality of word line forcing voltages, thereby increasing the data reliability of the unselected block.

Figure 15:
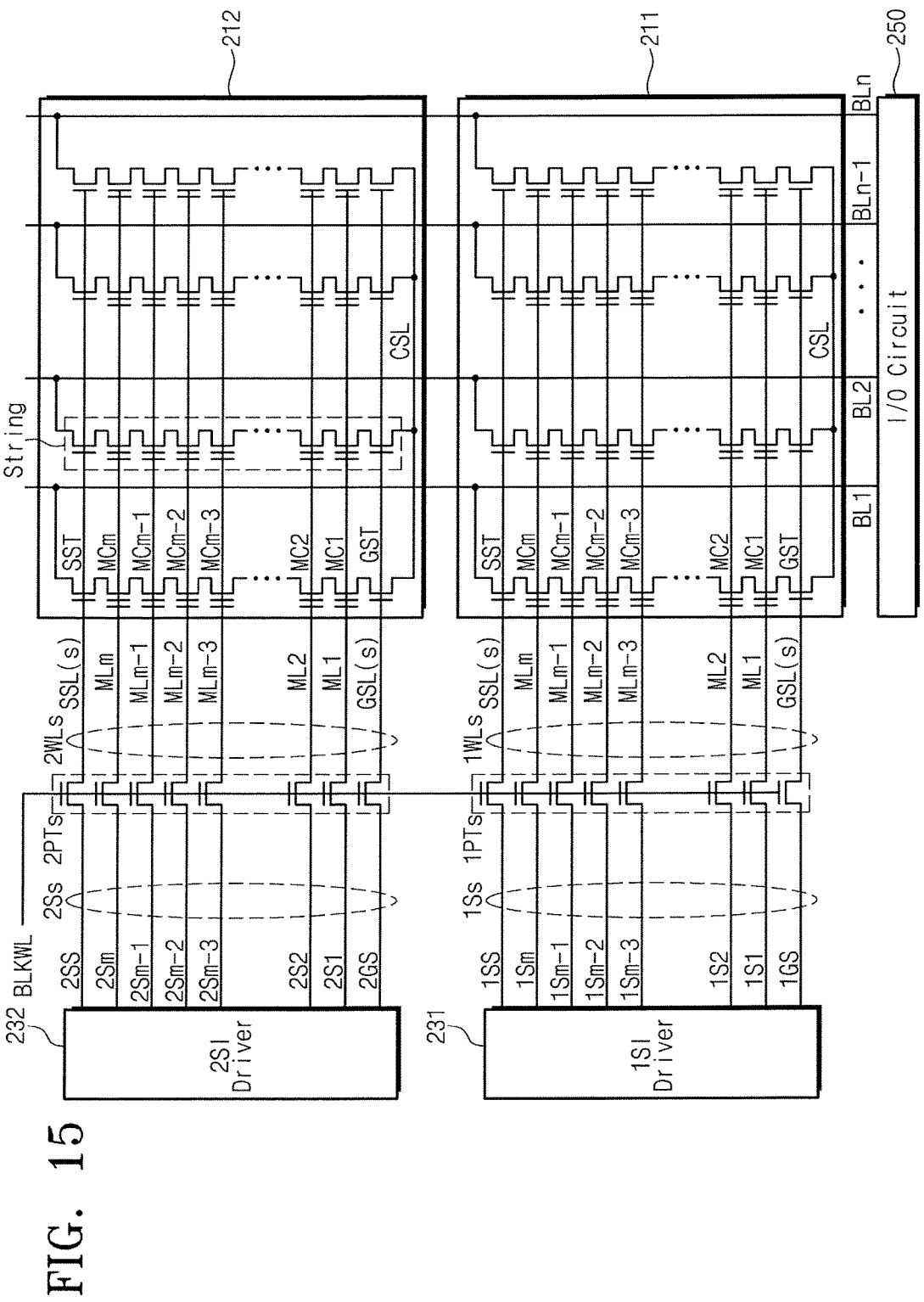
FIG. 15 is a circuit diagram for the first and the second blocks of FIG. 14.

FIG. 15 is a circuit diagram of the first and the second blocks of FIG. 14. Referring to FIG. 15, each of first and the second blocks 211 and 212 may include strings connected to a plurality of bit lines BL1 to BLn. Each of the strings may include at least one string selection transistor SST, a plurality of memory cells MC1 to MCm (m being an integer of 2 or more), at least one ground selection transistor GST serially connected between a bit line and a common source line CSL. Each of the memory cells MC1 to MCm (m being an integer of 2 or more) may store at least one bit of data or more. Although not illustrated in, each of the strings may include at least one dummy cell between a string selection transistor SST and the memory cells MC1 to MCm. Each string may further include at least one dummy cell between the memory cells MC1 to MCm and a ground selection transistor GST.

In addition, in FIG. 15, an input/output circuit 250 may include a plurality of page buffers (not shown) respectively connected to bit lines BL1 to BLn. Each of the page buffers may include a plurality of latches (not shown) temporarily storing a read data during a program operation or a read/verify operation.

First source lines 1SS, 1S1 to 1Sm and 1GS (1Ss) connected to a first source line driver 231 may be connected to at least one string selection line(s) SSL(s), first word lines WL1 to WLm (1WLs) and at least one ground selection line(s) GSL(s) through first pass transistors 1PTs, respectively. In addition, second source lines 2S1 to 2Sm and 2GS (2S$_S$) connected to a second source line driver 232 may be connected to at least one string selection line(s) SSL(s), second word lines WL1 to WLm (2WLs) and at least one ground selection line(s) GSL(s) through second pass transistors 2PTs, respectively. Here, gates of the first and second pass transistors 1PTs and 2PTs may be connected to one block word line BLKWL.

Figure 16:
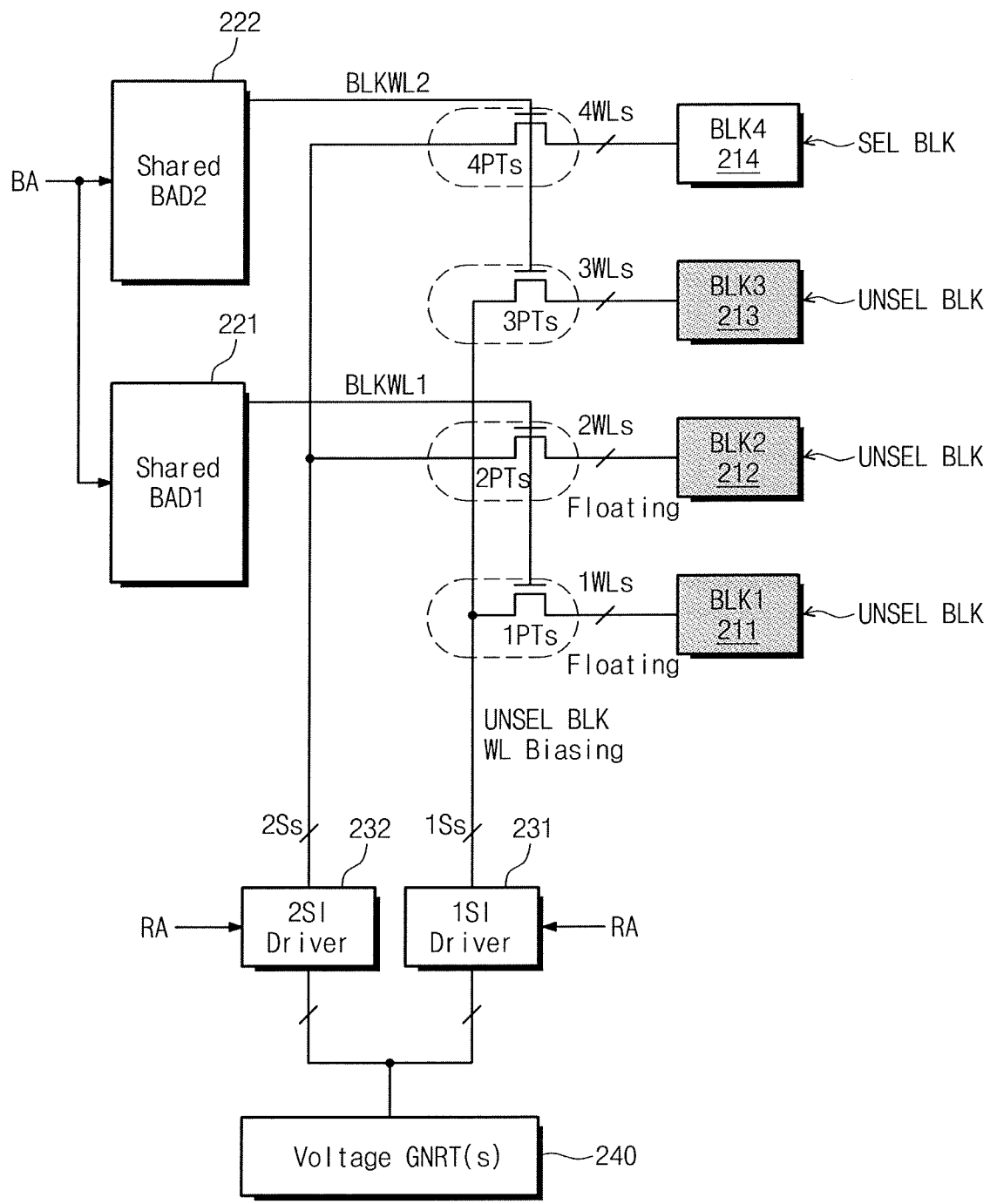
FIG. 16 is a diagram for explaining an unselected block which is not activated and an unselected block which is active in the non-volatile memory device according to an exemplary embodiment of the present inventive concept.

FIG. 16 is a diagram for explaining an activated unselected block and an inactivated unselected block of an non-volatile memory device according to an exemplary embodiment of the inventive concept. In FIG. 16, for the convenience of description, it is assumed that a fourth block is are activated according to a block address BA, and first to third blocks 211 to 213 are inactivated according to the block address BA. Here, whether or not of activation may be determined based on whether the pass transistors 1PTs to 4PTs are turned on. For example, whether a block is activated may be determined according to a voltage level of each of block word lines BLKWL1 and BLKWL2. Thus, the unselected block 213 may be an activated unselected block connected to a shared block word line BLKWL2 related to a selected block SEL BLK 214, and the other unselected blocks 211 and 212 may be inactivated.

First source lines 1Ss may be shared by the first and the third blocks 211 and 213, and second source lines 2Ss may be shared by the second and the fourth blocks 212 and 214.

Upon assuming that a program or read operation is carried out with respect to at least one word line in the fourth block 214 in response to an input row address RA, the fourth block 214 may be a selected block SEL BLK. At this time, remaining blocks 211 to 213 may be unselected blocks. Here, the first and the second blocks 211 and 212 may be an inactivated unselected block UNSEL BLK1 (a second unselected block) and the third block 213 may be an activated unselected block UNSEL BLK2 (a first selected block).

Below, it may be assumed that an activated unselected block (e.g., 213) may be the first unselected block and an inactivated unselected block (e.g., 211 or 212) may be the second unselected block. At an operation of the selected block SEL BLK, word lines of the first unselected block 213 may be divided into a plurality of word line regions to which different levels of bias voltages are applied respectively.

Word line regions may be biased with bias voltages Vfc 1 to Vfc q and word lines of the second selected blocks 211 and 213 may be floated.

Figure 17:
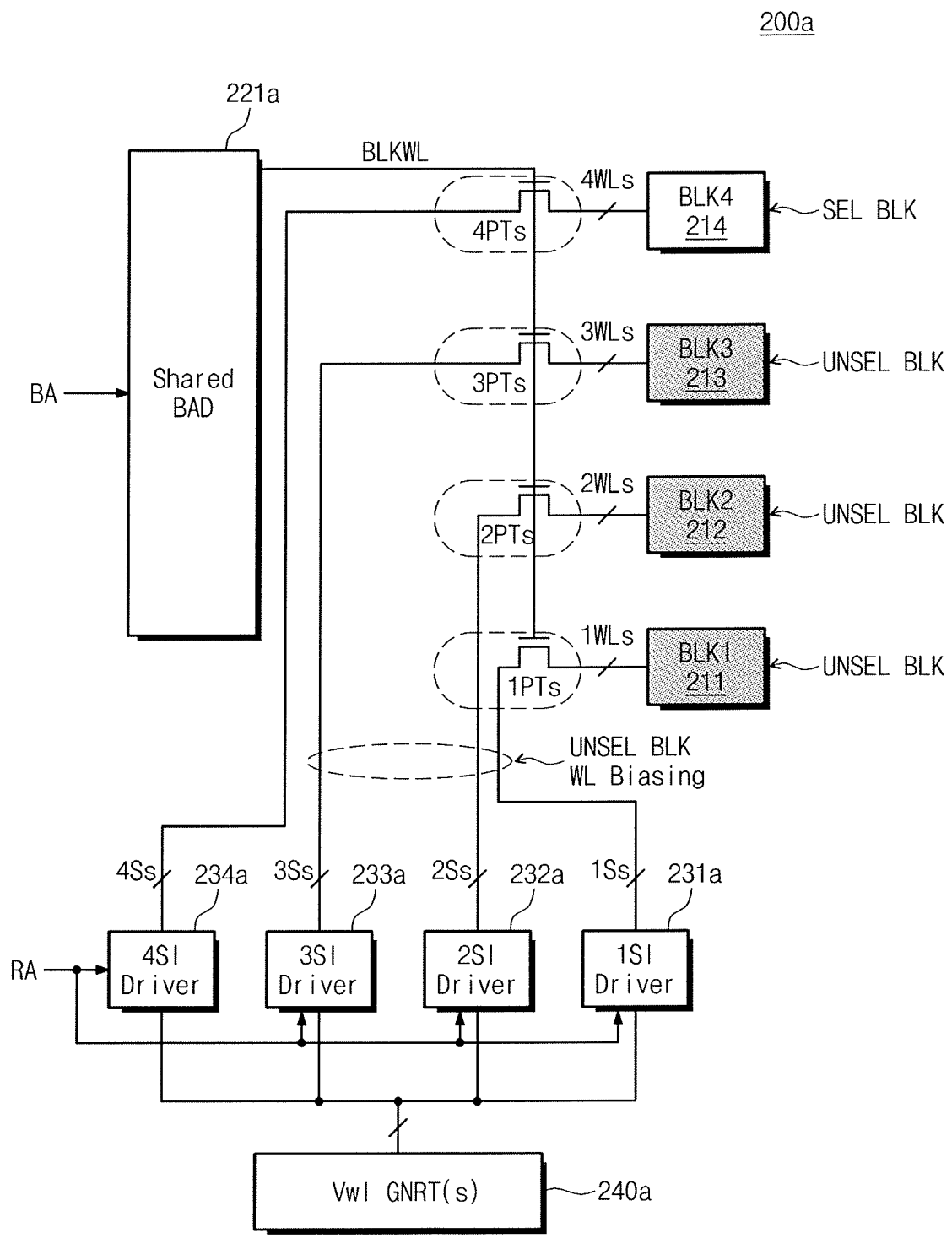
FIG. 17 is a block diagram illustrating a non-volatile memory device according to an exemplary embodiment of the present inventive concept.

FIG. 17 is a block diagram illustrating a non-volatile memory device according to an exemplary embodiment of the inventive concept. In FIG. 17, for the convenience of description, it is assumed that a fourth block 214 is a selected block SEL BLK and remaining blocks 211 to 213 are unselected blocks UNSEL BLK. For example, it is assumed that a program or read or erase operation is performed with respect to a fourth block 214. At this time, remaining blocks 211 to 213 may be unselected blocks UNSEL BLK, source line drivers 231*a* to 233*a* may divide word lines 1WLs, 2WLs, and 3WLs of an unselected block into a plurality of word line regions, and the source line drivers 231*a* to 233*a* may bias the word line regions with a plurality of word line forcing voltages to prevent negative boosting. Levels of the word line forcing voltages may vary according to a word line region. However, the present inventive concept is not limited thereto. The levels of the word lines forcing voltages applied to the word line regions may be the same.

Figure 18:
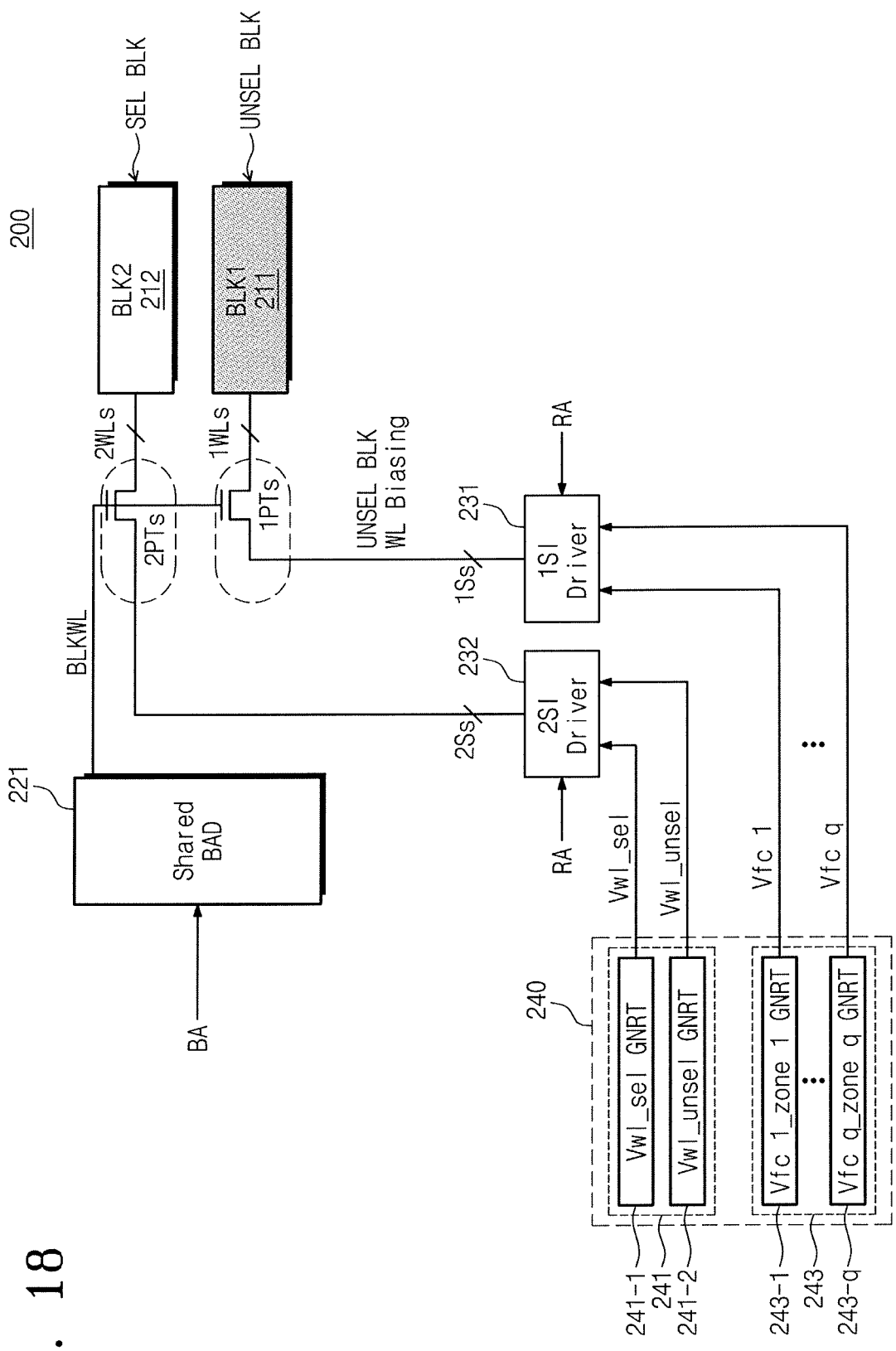
FIG. 18 is a diagram illustrating a word line voltage generator circuit according to an exemplary embodiment of the present inventive concept.

FIG. 18 is a diagram illustrating a word line voltage generator circuit according to an exemplary embodiment of the inventive concept. Referring to FIGS. 14 and 18, a word line voltage generator circuit 240 may include a first selection block word line voltage generator 241 and an unselected block word line voltage generator 243.

The first selection block voltage generator 241 may include a selection word line voltage generator 241-1 and a non-selection word line voltage generator 241-2.

The selection word line voltage generator 241-1 may generate a selection word line voltage Vwl_sel and a non-selection word line voltage Vwl_unsel to be applied to a selected block (e.g., 212). Here, the selection word line voltage Vwl_sel may be a program voltage, a read voltage, a read verify voltage, an ease word line voltage, or an erase verify voltage.

The non-selection word line voltage generator 241-2 may generate a non-selection word line voltage Vwl_unsel to be applied to the selected block 212. Here, the non-selection word line voltage Vwl_unsel may be a program pass voltage at a program operation or a read pass voltage at a read operation.

The unselected block word line voltage generator 243 may include a plurality of bias voltage generators 243-1 to 243-*q*. The non-selection word line voltage generator block 243 may generate bias voltages Vfc 1 to Vfc q to be applied to an unselected block (e.g., 211) connected to a shared block word line BLKWL shared with the select block 211. The bias voltages Vfc 1 to Vfc q may be voltage set to prevent negative boosting.

Figure 19:
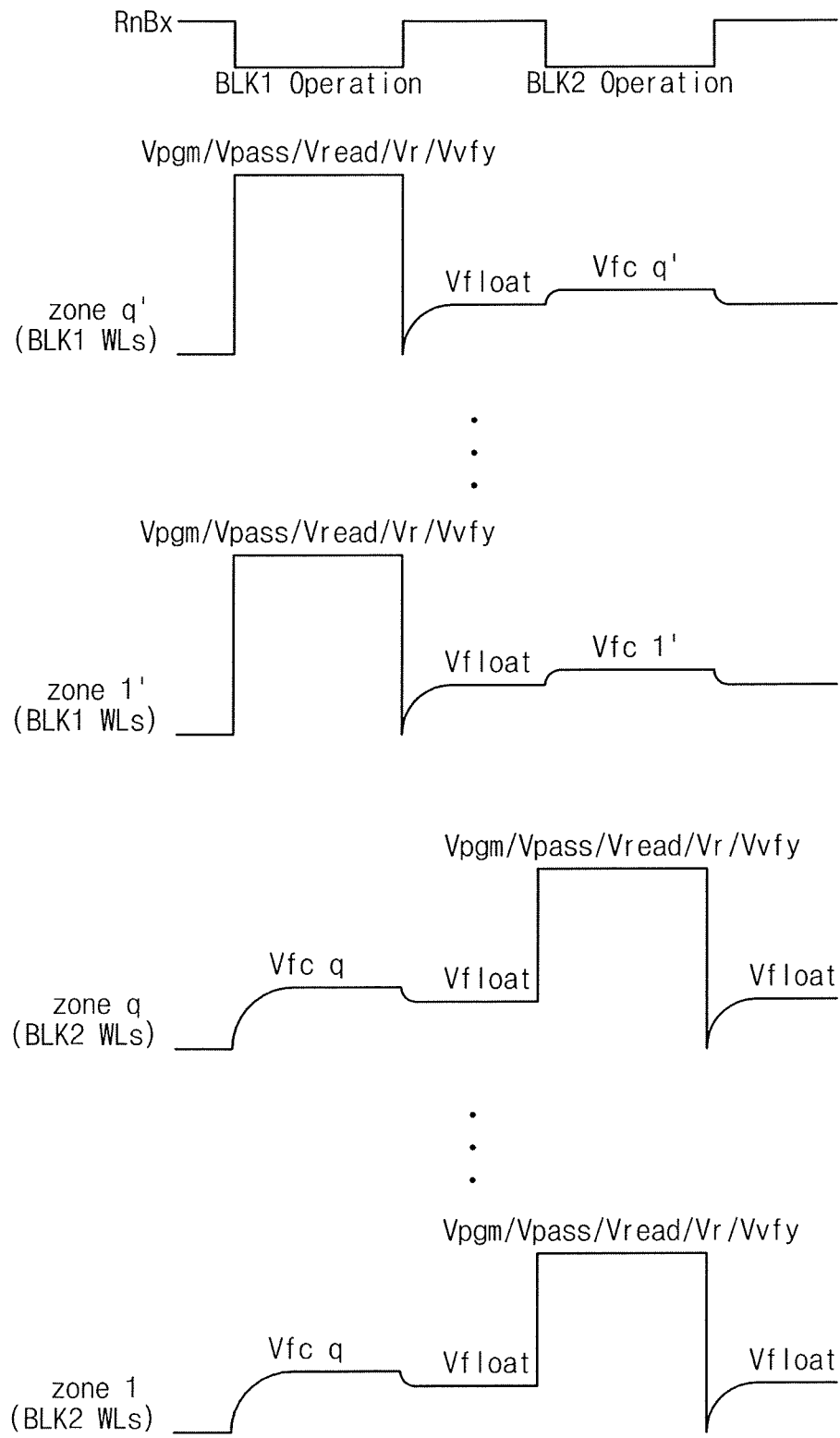
FIG. 19 is a diagram illustrating biasing of a plurality of word line regions for preventing negative boosting of an unselected block according to an exemplary embodiment of the present inventive concept.

FIG. 19 is a diagram illustrating biasing of a plurality of word line regions zone 1 to zone q for preventing negative boosting of an unselected block, according to an exemplary embodiment of the inventive concept.

Referring to FIG. 19, when an RnB (Ready/Busy) signal RnBx is low, an operation of a first block BLK1 may be performed. A driving voltage (e.g., a program voltage Vpgm, a pass voltage Vpass, a read pass voltage Vread, a read voltage Vr or a verify voltage Vvfy) may be applied to word lines WLs of the first block BLK1. At this time, a bias voltage Vfc may be applied to word lines WLs of a second block BLK2. As described in FIGS. 14 to 18, the word lines WLs of the second block BLK2 may be divided into word line regions zone 1 to zone q, and bias voltages Vfc 1 to Vfc q having different levels may be applied to the word line regions, respectively. After an operation of the first block BLK1 is completed, a recovery operation may be performed with respect to the word lines WLs of the first block BLK1. After the operation of the first block BLK1 is completed, the RnB signal RnBx may be high. At this time, all word lines WLs of the first and second blocks BLK1 and BLK2 may be floated, thereby causing coupling. Thus, the word lines WLs may be floated with a specified voltage Vfloat.

When the RnB signal RnBx is low, the driving voltage (e.g., a program voltage Vpgm, a pass voltage Vpass, a read pass voltage Vread, a read voltage Vr or a verify voltage Vvfy) may be applied to word lines WLs of the second block BLK2. At this time, a bias voltage Vfc' may be applied to word lines WLs of the first block BLK1. As described in FIGS. 14 to 18, word lines WLs of the second block BLK2 may be divided into word line regions zone 1' to zone q', and bias voltages Vfc 1' to Vfc q' having different levels may be applied to the word line regions zone 1' to zone q', respectively. After an operation of the second block BLK2 is completed, a recovery operation may be performed with respect to the word lines WLs of the second block BLK2.

After the operation of the second block BLK2 is completed, the RnB signal RnBx may become high. At this time, all word lines WLs of the first and second blocks BLK1 and BLK2 may be floated, thereby causing coupling. Thus, the word lines WLs are floated with a specified voltage Vfloat.

A recovery operation may be performed as described with reference to FIGS. 1 to 13. Sizes of word line regions zone 1 to zone q in the first block BLK1 may be different from those of word line regions zone 1' to zone q' in the second block BLK2. Levels of the bias voltages Vfc 1 to Vfc q applied to the first block BLK1 may be different from those of the bias voltages Vfc 1' to Vfc' q applied to the second block BLK2.

However, the present inventive concept is not limited thereto. For example, sizes of the word line regions zone 1 to zone q in the first block BLK1 may be the same as those of the word line regions zone 1' to zone q' in the second block BLK2. Therefore, levels of the bias voltages Vfc 1 to Vfc q applied to the first block BLK1 may be the same as those of bias voltages Vfc 1' to Vfc' q applied to the second block BLK2.

Figure 20:
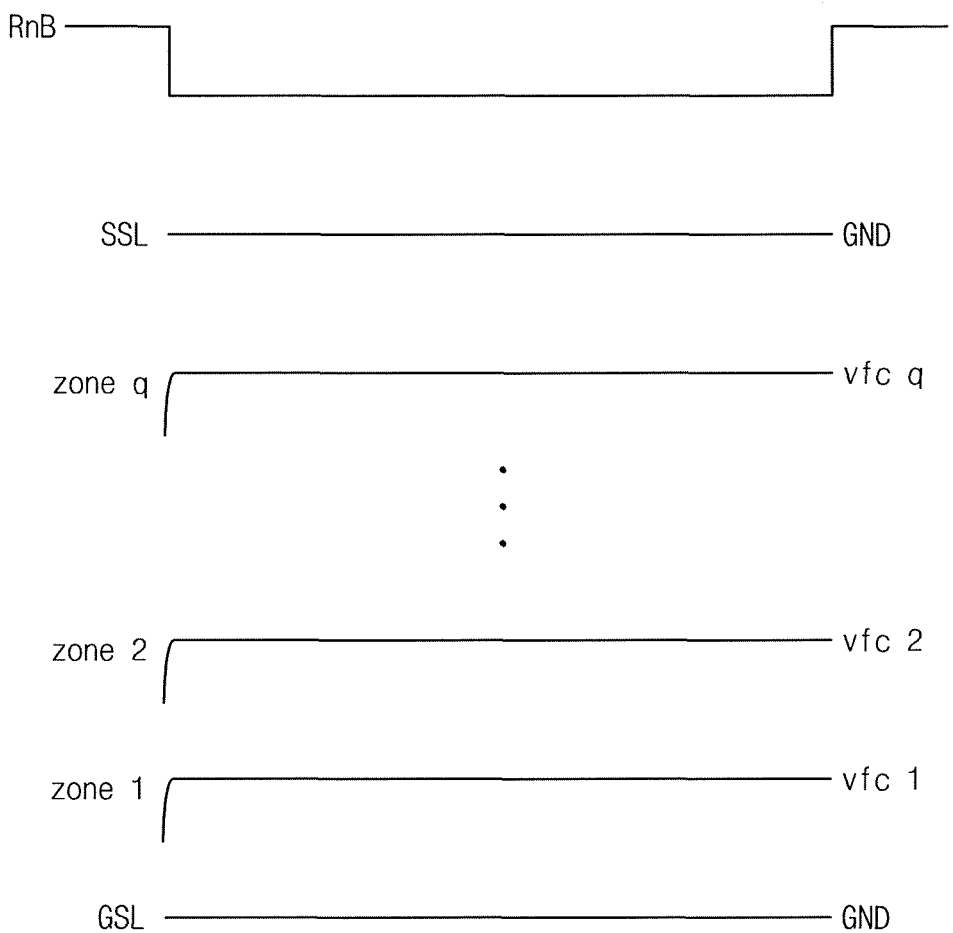
FIG. 20 is a diagram illustrating biasing a plurality of word line regions in an unselected block according to an exemplary embodiment of the present inventive concept.

FIG. 20 is a diagram illustrating biasing of a plurality of word line regions in an unselected block, according to an exemplary embodiment of the inventive concept. Referring to FIGS. 18 to 20, during an operation of an adjacent block (e.g., a program operation, a read operation or a read verify operation), word lines of an unselected block may be biased as follows. Since the adjacent block is operating, an RnB signal RnBx may be low. In this case, a ground voltage GND may be applied to a string selection line SSL and a ground selection line GSL of an unselected block. Word lines WLs may be divided according to the degrees of negative boosting into word line regions zone 1 to zone q, and bias voltages Vfc 1 to Vfc q having different levels may be applied to the word line regions zone 1 to zone q, respectively.

Figure 21:
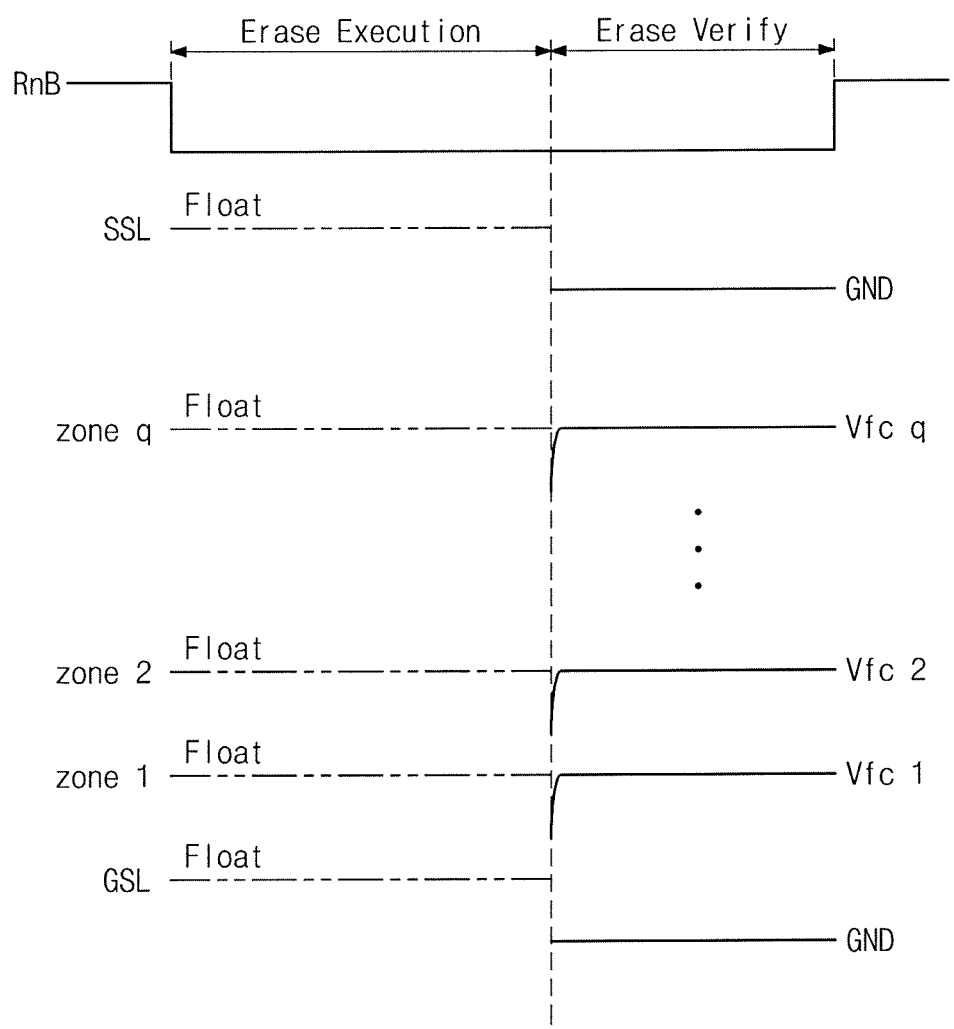
FIG. 21 is a diagram illustrating biasing a plurality of word line regions in the unselected block according to an exemplary embodiment of the present inventive concept.

FIG. 21 is a diagram illustrating biasing of a plurality of word line regions in an unselected block, according to an exemplary embodiment of the inventive concept. Referring to FIGS. 19 to 21, during an erase operation of an adjacent block, word line regions zone 1 to zone q of an unselected block may be biased as shown in an exemplary embodiment of FIG. 21.

An erase operation may be divided into an erase execution period and an erase verify period. In the erase execution period, a string selection line SSL, a word line WL and a ground selection line GSL all may be floated. During the erase verify period, a ground voltage GND may be applied to the string selection line SSL and the ground selection line GSL and bias voltages Vfc 1 to Vfc q having different levels may be applied to word line regions zone 1 to zone q, respectively.

Figure 22:
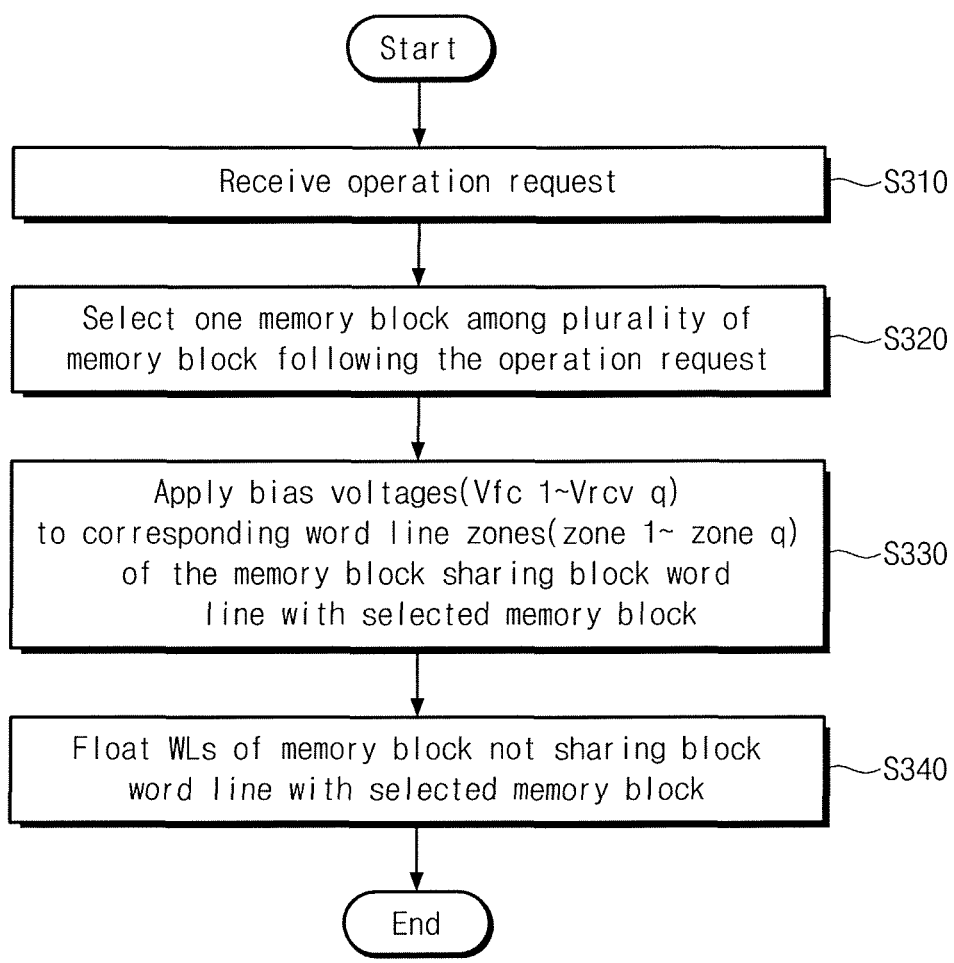
FIG. 22 is a flow chart illustrating a driving method of a non-volatile memory device according to an exemplary embodiment of the present inventive concept.

FIG. 22 is a flow chart illustrating a driving method of a non-volatile memory device according to an exemplary embodiment of the inventive concept. A driving method of a non-volatile memory device will be described with reference to FIGS. 18 to 22.

In step S310, the non-volatile memory device 200 may receive an operation request. In step S320, one memory block of a plurality of memory blocks may be selected according to the operation request. A selection word line voltage Vwl_sel and/or at least one non-selection word line voltage Vwl_unsel may be applied to word lines of a selected block SEL BLK.

In step 330, bias voltages Vfc 1 to Vfc q having different levels may be applied to word line regions zone 1 to zone q of an unselected block UNSEL BLK connected to a block word line BLKWL shared with a selected block SEL BLK, respectively.

On the other hand, in step 340, word lines of at least one memory blocks not connected to the block word line BLKWL of the selected block SEL BLK may be floated.

According to an exemplary embodiment of the inventive concept, bias voltages Vfc 1 to Vfc q may be applied to the word line regions zone 1 to zone q of the unselected block connected to the block word line BLKWL of the selected block SEL BLK, respectively. Word lines of a memory block not connected to a block word line of the selected block SEL BLK may be floated.

On the other hand, a word line voltage generating circuit 240 illustrated in FIG. 14 may include a plurality of word line voltage generators.

Figure 23:
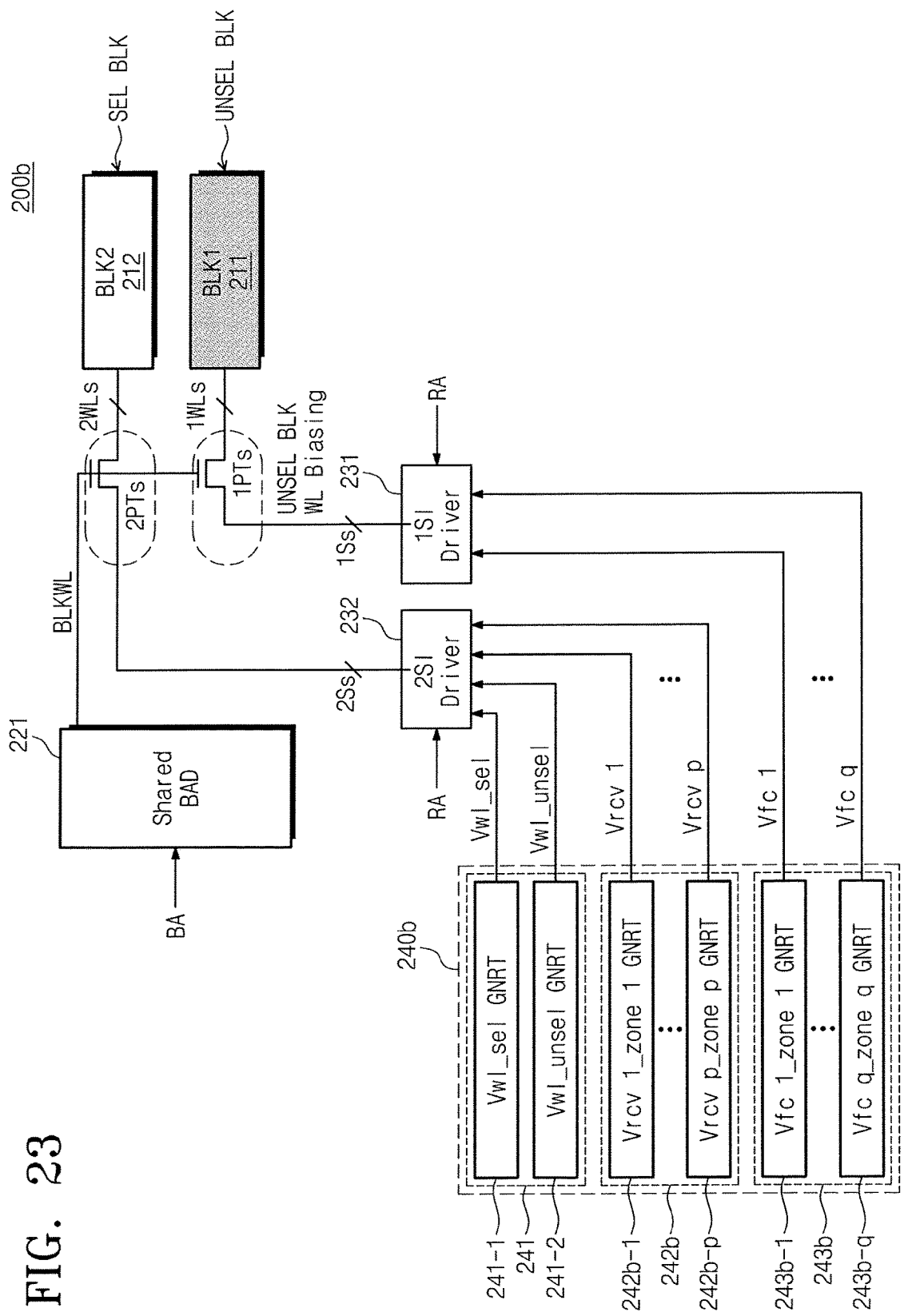
FIG. 23 is a diagram illustrating a word line voltage generator circuit according to an exemplary embodiment of the present inventive concept.

FIG. 23 is a diagram illustrating a word line voltage generator circuit according to an exemplary embodiment of the inventive concept. Referring to FIGS. 1 to 23, a word line voltage generating circuit 240b may include a first selected block word line voltage generator 241, a second selected block word line voltage generator 242b and an unselected block word line voltage generator 243b.

The first selected block word line voltage generator 241 may include a selection word line voltage generator 241-1 and a non-selection word line voltage generator 241-2.

The selection word line voltage generator 241-1 may generate a selection word line voltage Vwl_sel and a non-selection word line voltage Vwl_unsel to be applied to a selected block (e.g., 212). Here, the selection word line voltage Vwl_sel may be a program voltage, a read voltage, a read verify voltage, an erase word line voltage, or an erase verify voltage.

The non-selection word line voltage generator 241-2 may generate a non-selection word line voltage Vwl_unsel to be applied to the selected block 212. Here, the non-selection word line voltage Vwl_unsel may be a program pass voltage at a program operation and may be a read pass voltage at a read operation.

The second selection block voltage generator 242b may include a plurality of recovery voltage generators 242b-1 to 242b-p. The recovery voltage generators 242b-1 to 242b-p may generate recovery voltages Vrcv 1 to Vrcv p, (p being an integer of 2 or greater) having different levels, respectively. The recovery voltage generators 242b-1 to 242b-p may apply the recovery voltages Vrcv 1 to Vrcv p to recovery regions zone 1 to zone p of the selected block 212, respectively.

The recovery regions zone 1 to zone p may be program recovery regions zone 1 to zone x or read recovery regions zone 1 to zone y. Therefore, the recovery voltages Vrcv 1 to Vrcv q may be program recovery voltages Vrcv 1 to Vrcv x or read recovery voltages Vrcv 1 to Vrcv y.

An unselected block word line voltage generator 243b may include a plurality of bias voltage generators 243b-1 to 243b-q. The unselected block word line voltage generator 243b may generate bias voltages Vfc 1 to Vfc q applied to an unselected block (e.g., 211) connected to a block word line BLKWL shared with the selected block 212. Here, bias voltages Vfc 1 to Vfc q may be voltage for preventing negative boosting. Furthermore, bias voltages Vfc 1 to Vfc q may have different voltage levels from each other.

Figure 24:
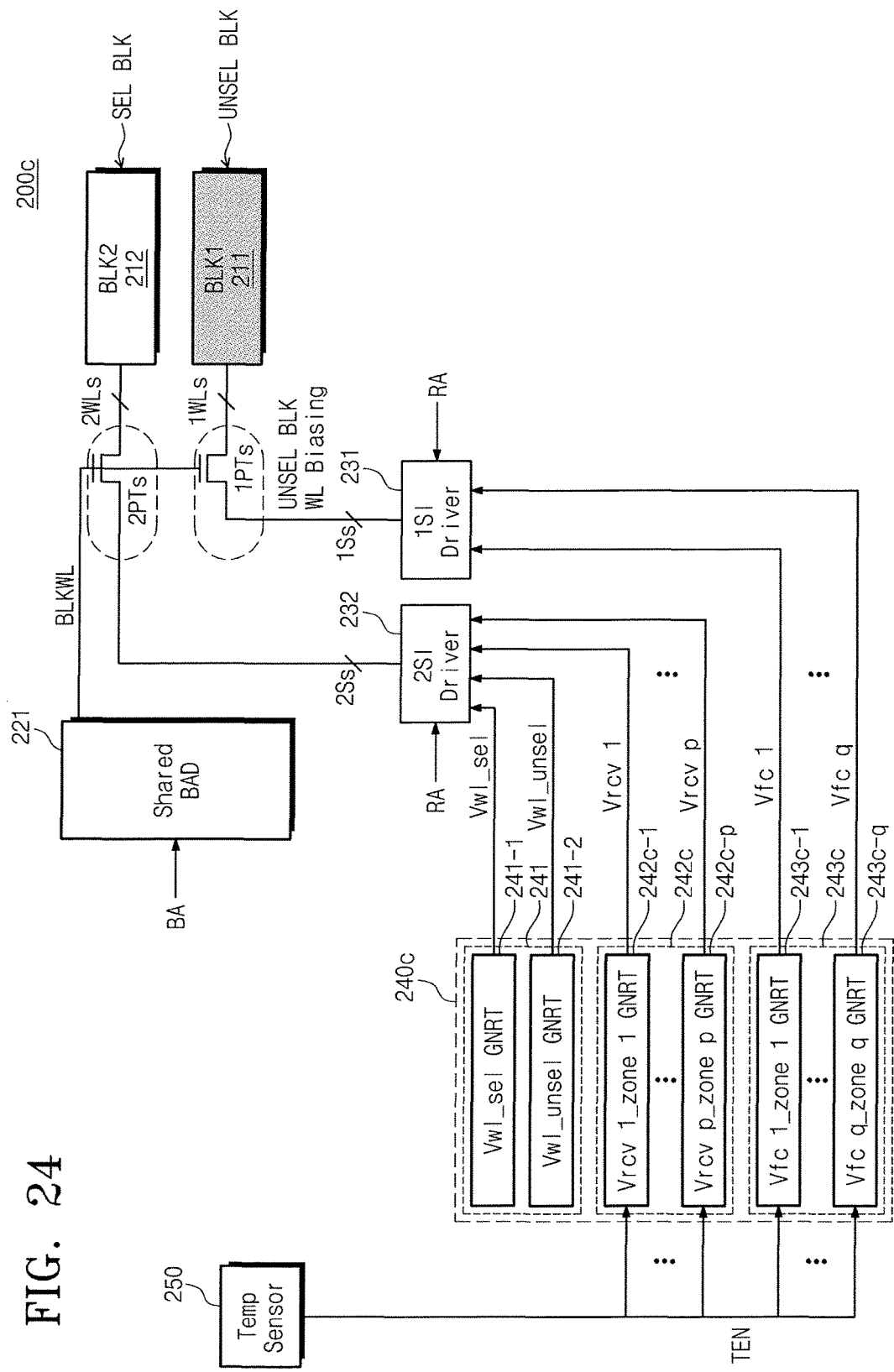
FIG. 24 is a diagram illustrating a word line voltage generator circuit according to an exemplary embodiment of the present inventive concept.

FIG. 24 is a diagram illustrating a word line voltage generator circuit according to an exemplary embodiment of the inventive concept. As compared with a non-volatile memory device 200b illustrated in FIG. 23, a non-volatile memory device 200c illustrated in FIG. 24 may include a word line voltage generator 240c having a plurality of recovery voltage generators 242c-1 to 242c-p and a plurality of bias voltage generators 243c-1 to 243c-q, and a temperature sensor 250 for generating a temperature-applied enable signal (TEN).

Each of the recovery voltage generators 242c-1 to 242c-p may generate recovery voltages Vrcv 1 to Vrcv p having different voltage levels based on a temperature variation. The bias voltage generators 243c-1 to 243c-q may generate bias voltages Vfc 1 to Vfc q having different voltage levels based on the temperature variation.

Levels of the recovery voltages Vrcv 1 to Vrcv p and the bias voltages Vfc 1 to Vfc q may be increased as a temperature increases. However, the present inventive concept is not limited thereto. For example, levels of the recovery voltages Vrcv 1 to Vrcv p and the bias voltages Vfc 1 to Vfc q may be decreased as the temperature increases.

On the other hand, the non-volatile memory device 200c of FIG. 24 may generate a temperature enable signal TEN using an inner temperature sensor 250 to generate word line voltages according to the temperature enable signal TEN. However, the present inventive concept is not limited thereto. For example, a non-volatile memory device may receive temperature information from an outside (e.g., a memory controller or a host) and may generate word line voltages according to the temperature information.

Figure 25:
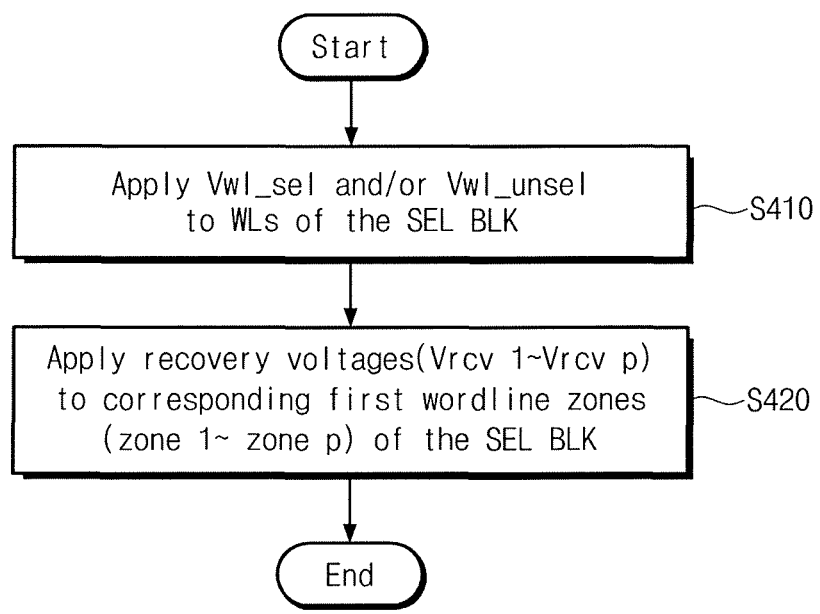
FIG. 25 is a flow chart illustrating a biasing method of an unselected block word line according to an exemplary embodiment of the present inventive concept.

FIG. 25 is a flow chart illustrating a method of biasing an unselected block word line, according to an exemplary embodiment of the inventive concept. Referring to FIGS. 23 and 25, in step S410, a selection word line voltage generator 241 may apply a selection word line voltage Vwl_sel and/or a non-selection word line voltage Vwl_unsel to a selected block (e.g., 212).

In step S420, recovery voltage generators 242b-1 to 242b-p may apply recovery voltages Vrcv 1 to Vrcv p to word line recovery regions zone 1 to zone p of the selected block 212, respectively.

Figure 26:
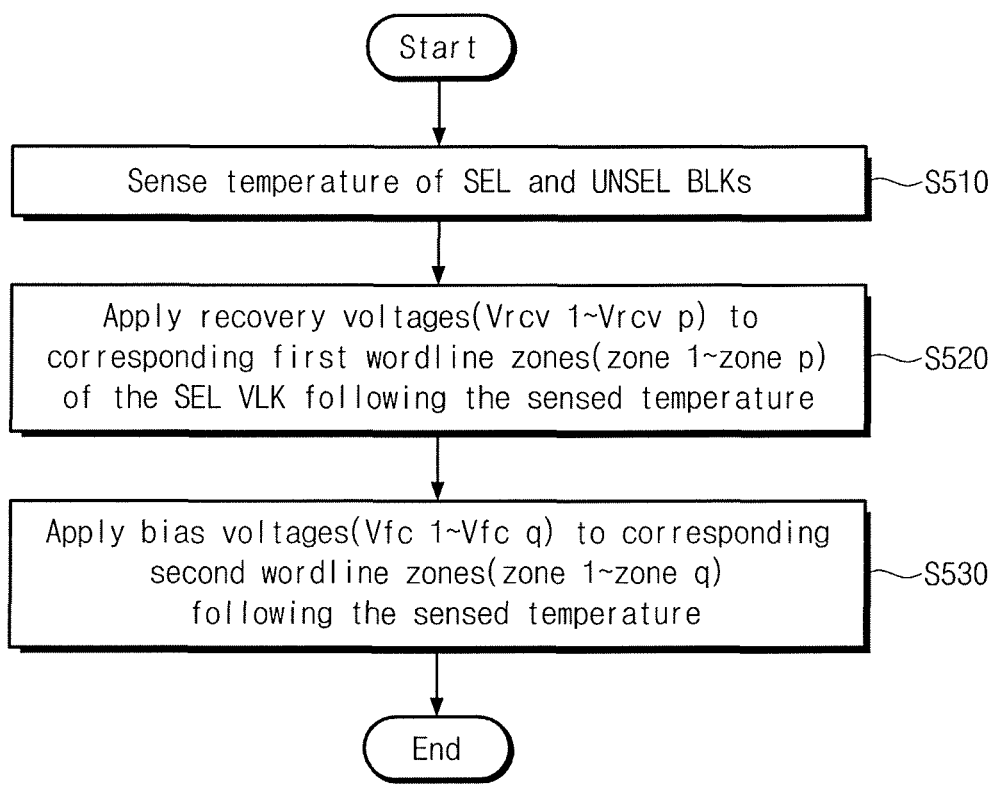
FIG. 26 is a flow chart illustrating a recovery operation of a selected block and a word line biasing method of an unselected block according to an exemplary embodiment of the present inventive concept.

FIG. 26 is a flow chart illustrating a recovery operation of a selected block and a word line biasing method of an unselected block, according to an exemplary embodiment of the inventive concept. Referring to FIGS. 24 to 26, in step S510, a temperature of the non-volatile memory device 200c may be sensed. In step 520, recovery voltages Vrcv 1 to Vrcv p of which the levels are adjusted to be fit to the sensed temperature may be applied to recovery regions zone 1 to zone p. Therefore, the bias voltages Vfc 1 to Vfc q of which the levels are adjusted to be fit to the sensed temperature may be applied to word line regions zone 1 to zone q, respectively. In step 530, bias voltages Vfc 1 to Vfc q to word line recovery regions zone 1 to zone q of the selected block 212, respectively.

Figure 27:
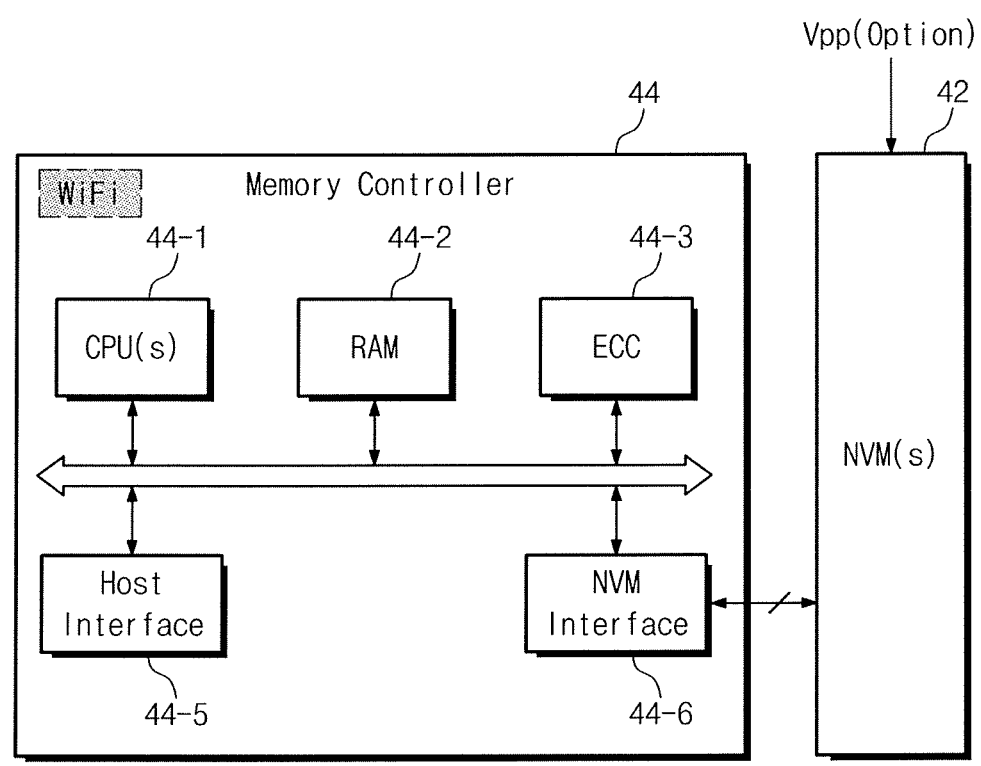
FIG. 27 is a block diagram illustrating a memory system according to an exemplary embodiment of the present inventive concept.

FIG. 27 is a block diagram illustrating a memory system according to an exemplary embodiment of the inventive concept. Referring to FIG. 27, a storage device 40 may include at least one non-volatile memory device 42 and a memory controller 44 to control the non-volatile memory device 42. The storage device 40 illustrated in FIG. 27 may be a storage medium such as a memory card (e.g., CF, SD, microSD, etc.), a USB storage devices, and the like.

The non-volatile memory device 42 may be implemented with a non-volatile memory device 100 or 200 illustrated in FIGS. 1 and 14. In addition, the memory controller 44 may perform an operation for reinforcing immunity to read disturbance, based on at least one environmental information such as the number of program loops, an operation mode, pass or fail information of a particular program state, state information, temperature information, a program/erase (P/E) cycle, information related to the number of operations, information related to a physical structure of a word line, position information, selection or non-selection information, time information, and the like.

For example, voltage levels of recovery voltages applied to first or second word line regions of a selected block may be set according to at least one piece of information. Therefore, voltage levels of bias voltages applied to an unselected block may be set according to at least one piece of information.

In addition, the memory controller 44 may initiate biasing of a plurality of third word line regions in an unselected block in response to a specific request of a host. For example, when a request of a reliable read operation mode or a high-speed read operation is received from a host, the memory controller 44 may perform word line biasing of an unselected block.

Moreover, the memory controller 44 may control a read, a write and an erase operation for the non-volatile memory device 42 in response to a request from the host. The memory controller 44 may include at least one central processing unit 44-1, a buffer memory (RAM) 44-2, an error correction circuit (ECC) 44-3, a host interface 44-5, and a nonvolatile memory (NVM) interface 44-6.

The central processing unit 44-1 may control an overall operation (e.g., a read, a write, file system management, bad page management, etc.) of the nonvolatile memory device 42. The RAM 44-2 may operate according to a control of a central processing unit 44-1 and may be used as a work memory, a buffer memory, a cache memory, and the like. When the RAM 44-2 is used as the work memory, data processed by the central processing unit 44-1 may be temporarily stored. When the RAM 44-2 is used as the buffer memory, the RAM 44-2 may be used for buffering data to be transmitted from the host to the nonvolatile memory device 42 or from the nonvolatile memory device 42 to the host. When the RAM 44-2 is used as the cache memory, the nonvolatile memory device 42 with a low speed may operate at a high speed.

The ECC circuit 44-3 may generate an error correction code (ECC to correct a fail bit or an error bit of data received from the nonvolatile memory device 42. The ECC circuit 44-3 may perform an error correction encoding of data supplied from the nonvolatile memory device 42 and may form data including at least one parity bit. A parity bit may be stored to the nonvolatile memory device 42.

Furthermore, the ECC 44-3 may perform error correction decoding with respect to data outputted from the non-volatile memory device 42. The ECC 44-3 may correct an error using parity. The ECC 44-3 may correct the error using a coded modulation such as a low density parity check (LDPC) code, a BCH code, a turbo code, a Reed-Solomon code, a convolution code, a recursive systematic code (RSC), a trellis-coded modulation (TCM), a block coded modulation (BCM), and the like.

The memory controller 44 may exchange data with the host through the host interface 44-5 and may exchange data with the non-volatile memory device 42 through an NVM interface 44-6. The host interface 44-5 may have at least one of a parallel AT attachment (PATA) bus, a serial AT attachment (SATA) bus, SCSI, USB, PCIe, SD, SAS, UFS, a NAND interface, and the like.

In an exemplary embodiment, the memory controller 44 may be equipped with a wireless communication function (e.g., WiFi).

According to an exemplary embodiment of the inventive concept, during a recovery operation of a selected block, the storage device 40 may block disturbance by biasing first or second word line regions using recovery voltages having different levels, respectively, and may reduce power consumption and operating time by initiating an operation, with word lines floated.

In addition, according to an exemplary embodiment of the inventive concept, the storage device 40 may increase reliability of data by biasing third word line regions of an unselected block with different word line forcing voltages having different levels in response to an outside request, respectively.

Figure 28:
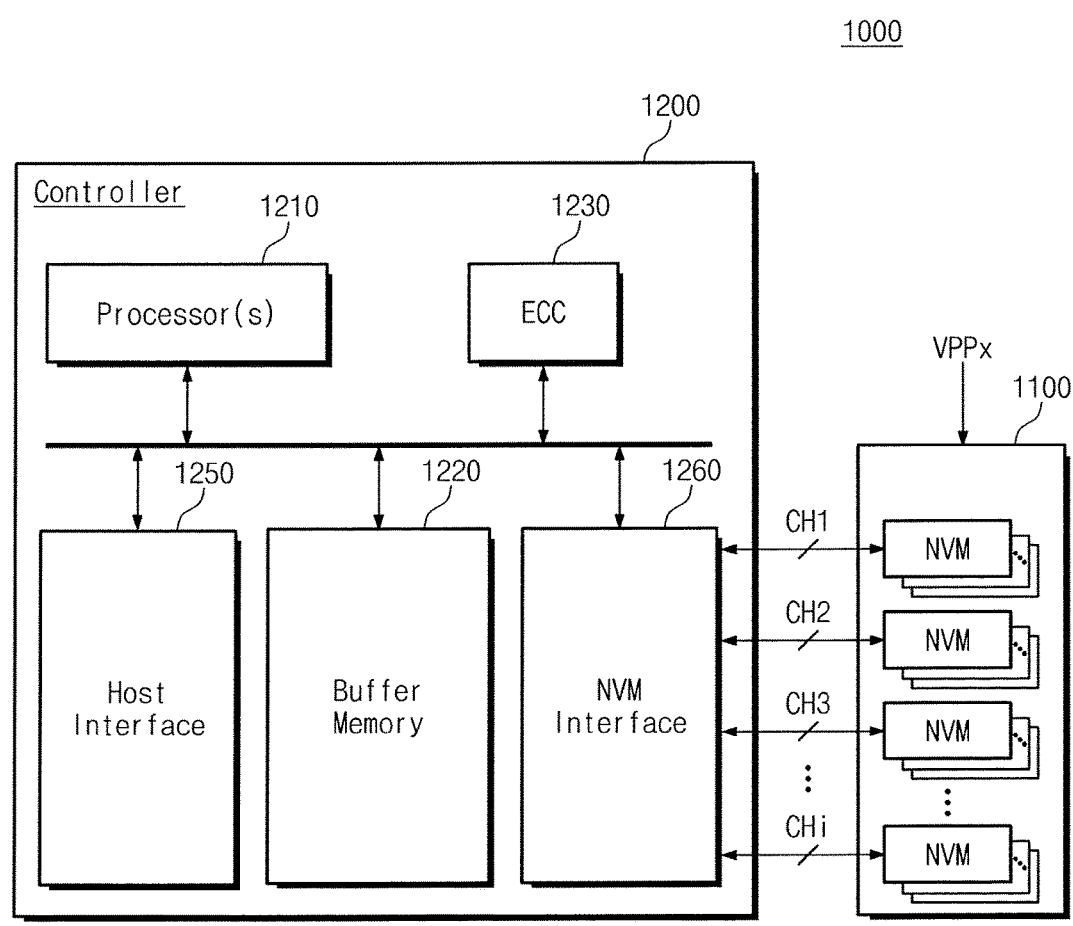
FIG. 28 is a block diagram illustrating an SSD according to an exemplary embodiment of the present inventive concept.

FIG. 28 is a block diagram illustrating a solid state drive (SSD) according to an exemplary embodiment of the inventive concept. Referring to FIG. 28, a solid state drive (SSD) 1000 may include a plurality of non-volatile memory devices 1100 and an SSD controller 1200.

The non-volatile memory devices 1100 may be implemented to receive an external high voltage Vpp. Each of the non-volatile memory devices 1100 may be implemented with a non-volatile memory device 100 or 200 illustrated in FIGS. 1 and 14. The SSD controller 1200 may be coupled to the non-volatile memory devices 1100 through a plurality of channels CHI to Chi (i being an integer of 2 or greater). The SSD controller 1200 may include at least one processor 1210, a buffer memory 1220, an error correction circuit (ECC) 1230, a host interface 1250 and a non-volatile memory interface 1260.

The buffer memory 1220 may temporarily store data required for an operation of the memory controller 1200. The buffer memory 1220 may include a plurality of memory lines for storing data or instruction. Here, the memory lines may be mapped in various ways to cache lines. The ECC 1230 may calculate an error correction code value of data to be programmed during a write operation, may correct an error of read data based on the error correction code value during a read operation, and may correct an error of data which is restored from the nonvolatile memory device 1100 during a restoration operation. Although not illustrated, a code memory for storing code data needed to operate the memory controller 1200 may be further included. The code memory may be implemented with a nonvolatile memory device.

The host interface 1250 may provide an interface function with an outside device. Here, the host interface 1250 may be a NAND flash interface. In addition, the host interface 1250 may be implemented with a variety of interfaces. The non-volatile memory interface 1260 may provide an interface function with a non-volatile memory device 1100.

According to an exemplary embodiment of the present invention, the performance of the SSD 1000 may be increased by blocking disturbance at a program, a read or an erase operation.

According to an exemplary embodiment of the inventive concept, the SSD 1000 may bias a plurality of third word line regions of an unselected block with a plurality of forcing voltages having different levels, respectively, thereby markedly improving the reliability of data.

Figure 29:
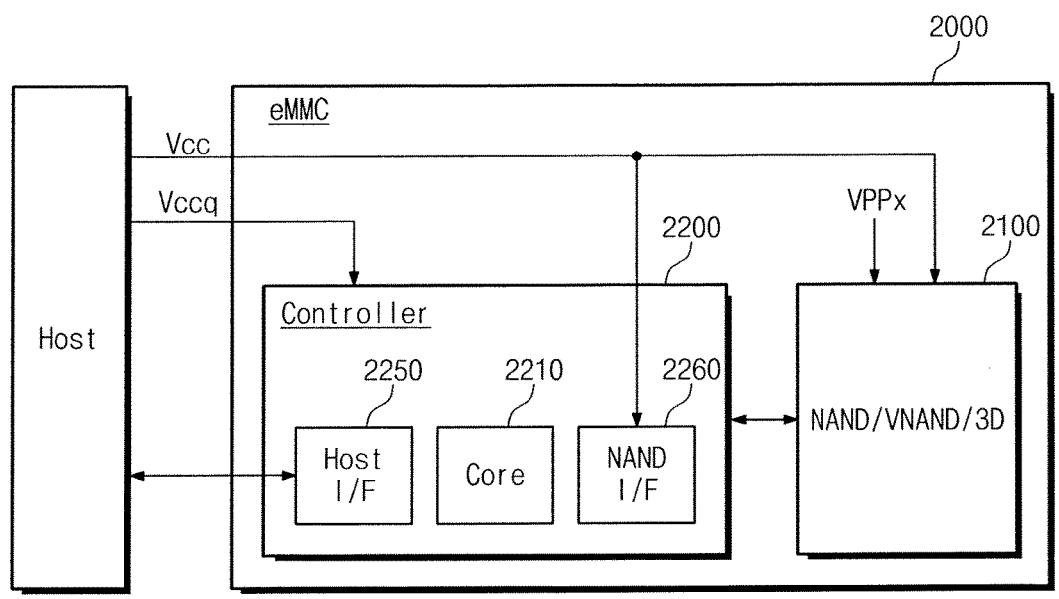
FIG. 29 is a block diagram illustrating an eMMC according to an exemplary embodiment of the inventive concept.

FIG. 29 is a block diagram illustrating an eMMC according to an embodiment of the inventive concept, Referring to FIG. 29, an eMMC 2000 may include at least one NAND flash memory device 2100 and a controller 2200.

The NAND flash memory device 2100 may be implemented with a non-volatile memory device 100 illustrated in FIGS. 1 and 14. The memory controller 2200 may be connected to the NAND flash memory device 2100 through a plurality of channels. The memory controller 2200 may be implemented with the memory controller 200 illustrated in FIG. 14. The memory controller 2200 may include at least one controller core 2210, a host interface 2250 and an NAND interface 2260. The at least one controller core 2210 may control an overall operation of the eMMC 2000.

The host interface 2250 may interface between a controller 2210 and a host. The NAND interface 2260 may interface between the NAND flash memory interface device 2100 and the controller 2200. In the embodiment, the host interface 2250 may be a parallel interface (e.g., an MMC interface). In another embodiment, the host interface 2250 of the eMMC 2000 may be a serial interface (e.g., UHS-II, UFS interface). In another embodiment, the host interface 2250 may be a NAND interface.

The eMMC 2000 may receive power supply voltages (e.g., Vcc, Vccq) from the host. Here, a first power supply voltage Vcc (e.g., 3.3V) may be provided to the NAND flash memory device 2100 and NAND interface 2260, and a second power supply voltage Vccq (e.g., 1.8V or 3.3V) may be provided to the controller 2200. In the embodiment, the eMMC (2000) may be provided with an external high voltage Vpp, optionally.

According to an exemplary embodiment of the inventive concept, the eMMC 2000 may bias a plurality of third word line regions of an unselected block with a plurality of forcing voltages having different levels, respectively, thereby markedly improving the reliability of data.

In exemplary embodiment, during a recovery operation in a selected block, a non-volatile memory device may apply a predetermined voltage to a plurality of word line regions and may bias a plurality of word line regions of an adjacent block, thereby improving the data reliability of the selected and unselected blocks.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims. It is therefore desired that the present exemplary embodiments be considered in all respects as illustrative and not restrictive, reference being made to the appended claims rather than the foregoing description to indicate the scope of the inventive concept.

What is claimed is:

1. A method of operating a nonvolatile memory device including a plurality of memory blocks, each memory block having a plurality of word lines, the method comprising:
   applying a setup voltage to the word lines, wherein the word lines are divided into a plurality of recovery regions;
   applying a word line voltage to a first word line selected from the word lines;
   and
   applying a plurality of recovery voltages to the plurality of recovery regions,
   wherein each recovery voltage is applied to at least one corresponding word line of the word lines,
   wherein the recovery voltages have different voltage levels from each other, and
   wherein the voltage levels of the recovery voltages are different from a voltage level of the setup voltage.

2. The method of claim 1,
   wherein the setup voltage is a pass voltage in a program operation.

3. The method of claim 2,
   wherein the word line voltage is a program voltage in the program operation.

4. The method of claim 1,
   wherein in a read operation, the setup voltage includes a word line setup voltage and a read pass voltage, the word line setup voltage being applied to the first word line and the read pass voltage being applied to the other of the word lines, and
   wherein the read pass voltage is higher than the word line setup voltage.

5. The method of claim 4,
   wherein the word line voltage comprises a read voltage.

6. The method of claim 5,
   wherein the read voltage includes a first read voltage and a second read voltage higher than the first read voltage, and
   wherein the applying of the word line voltage includes:
      applying the first read voltage as the word line voltage to the first word line; and
      after the applying of the first read voltage, applying the second read voltage as the word line voltage to the first word line.

7. The method of claim 1,
   wherein the voltage levels of the recovery voltages are varied according to a temperature or a program/erase cycle.

* * * * *